US012610595B2

(12) United States Patent
Lee et al.

(10) Patent No.: US 12,610,595 B2
(45) Date of Patent: Apr. 21, 2026

(54) INTEGRATED CIRCUIT DEVICE

(71) Applicant: Samsung Electronics Co., Ltd., Suwon-si (KR)

(72) Inventors: Sangmoon Lee, Suwon-si (KR); Jinbum Kim, Seoul (KR); Hyojin Kim, Hwaseong-si (KR); Yongjun Nam, Hwaseong-si (KR); Sujin Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1010 days.

(21) Appl. No.: 17/577,088

(22) Filed: Jan. 17, 2022

(65) Prior Publication Data

US 2023/0006040 A1     Jan. 5, 2023

(30) Foreign Application Priority Data

Jul. 2, 2021     (KR) ......................... 10-2021-0087400

(51) Int. Cl.
H10D 62/10          (2025.01)
H10D 30/67          (2025.01)

(52) U.S. Cl.
CPC ....... H10D 62/113 (2025.01); H10D 30/6735 (2025.01); H10D 30/6757 (2025.01); H10D 62/118 (2025.01)

(58) Field of Classification Search
CPC ............. H01L 29/0642; H01L 29/0665; H01L 29/42392; H01L 29/78696; H01L 29/0673; H01L 29/0847; H01L 29/1079; H01L 29/155; H01L 29/66439; H01L 29/775; H01L 29/157; H01L 27/0886; H01L 29/0684; H01L 29/785; H01L 21/823412; H01L 21/823418; H01L 21/823437; H01L 21/823462; H01L 27/088; B82Y 10/00

(Continued)

(56) References Cited

U.S. PATENT DOCUMENTS 6,458,662 B1     10/2002   Yu
6,891,202 B2 *   5/2005    Kish, Jr.  ............... H01S 5/2231
                                                    257/97

(Continued)

FOREIGN PATENT DOCUMENTS

KR     10-2017-0088115 A     8/2017
KR     10-2020-0029264 A     3/2020

*Primary Examiner* — Wael M Fahmy
*Assistant Examiner* — Fernando Jose Ramos-Diaz
(74) *Attorney, Agent, or Firm* — Wolf, Greenfield & Sacks, P.C.

(57)          ABSTRACT

An integrated circuit (IC) device includes a fin-type active region extending on a substrate in a first lateral direction. A gate line extends on the fin-type active region in a second lateral direction. The second lateral direction intersects the first lateral direction. A channel region is between the substrate and the gate line. A source/drain region is adjacent to the gate line on the fin-type active region and has a sidewall facing the channel region. A superlattice barrier is between the substrate and the channel region. The superlattice barrier is in contact with the source/drain region. The superlattice barrier has a structure in which a plurality of first sub-layers including a semiconductor layer doped with oxygen atoms and a plurality of second sub-layers including an undoped semiconductor layer are alternately stacked.

20 Claims, 33 Drawing Sheets

(58) Field of Classification Search
USPC .......................................................... 257/401
See application file for complete search history.

(56) References Cited

U.S. PATENT DOCUMENTS

| | | | |
|---|---|---|---|
| 7,531,828 B2 | 5/2009 | Mears et al. | |
| 7,612,366 B2 | 11/2009 | Mears et al. | |
| 7,659,539 B2 | 2/2010 | Kreps et al. | |
| 7,767,539 B2 | 8/2010 | Gauthier, Jr. et al. | |
| 10,468,486 B2 | 11/2019 | Wu et al. | |
| 10,580,867 B1 | 3/2020 | Takeuchi et al. | |
| 10,797,163 B1 | 10/2020 | Yu et al. | |
| 10,930,734 B2 | 2/2021 | Bao et al. | |
| 10,937,907 B2 | 3/2021 | Brask et al. | |
| 2012/0319162 A1* | 12/2012 | Araki ................... | H01L 21/0262 |
| | | | 257/E33.023 |
| 2014/0084246 A1* | 3/2014 | Pillarisetty ............. | H10D 30/43 |
| | | | 257/E29.245 |
| 2017/0213913 A1* | 7/2017 | Lee ...................... | H10D 62/402 |
| 2020/0027877 A1 | 1/2020 | Kim et al. | |
| 2020/0161429 A1* | 5/2020 | Takeuchi .......... | H01L 21/26533 |
| 2020/0176633 A1* | 6/2020 | Hiramatsu .......... | H01L 21/0254 |
| 2020/0365586 A1* | 11/2020 | Shin ...................... | H10D 30/62 |
| 2021/0343841 A1* | 11/2021 | Shin ...................... | H10D 30/43 |

* cited by examiner

100

EX1

164

144
142
118

130
152
N3
N2 }NSS
N1
152
}SL 160M
160S
160S
160S

160

R1

FA

102

Z
Y⊗→X

X1 – X1'

Y2 - Y2'

700

744

742
730

719
AG7
R7

SL7

F7     F7     714

STR7

702

Y7B – Y7B'

Z
X ⊙ ─→ Y

INTEGRATED CIRCUIT DEVICE

CROSS-REFERENCE TO RELATED APPLICATION

This application is based on and claims priority under 35 U.S.C. § 119 to Korean Patent Application No. 10-2021-0087400, filed on Jul. 2, 2021, in the Korean Intellectual Property Office, the disclosure of which is incorporated by reference herein in its entirety.

BACKGROUND

The inventive concepts relate to an integrated circuit (IC) device, and more particularly, to an IC device including a fin field-effect transistor (FinFET).

In recent years, as the downscaling of IC devices has rapidly progressed, it has become necessary to ensure not only a high operating speed but also high operating accuracy in IC devices. In addition, as the integration density of IC devices has increased and the sizes of IC devices have been reduced, it has become necessary to develop new structures capable of improving the performance and reliability of nanosheet field-effect transistors (FETs).

SUMMARY

The inventive concepts provide an integrated circuit (IC), which may reduce contact resistance of a source/drain contact and/or improve the distribution of electrical characteristics in a nanosheet field-effect transistor (FET).

According to some example embodiments of the inventive concepts, there is provided an IC device including a fin-type active region extending on a substrate in a first lateral direction. A gate line extends on the fin-type active region in a second lateral direction The second lateral direction intersects the first lateral direction. A channel region is between the substrate and the gate line. A source/drain region is adjacent to the gate line on the fin-type active region. The source/drain region has a sidewall facing the channel region. A superlattice barrier is between the substrate and the channel region. The superlattice barrier is in contact with the source/drain region. The superlattice barrier has a structure in which a plurality of first sub-layers including a semiconductor layer doped with oxygen atoms and a plurality of second sub-layers including an undoped semiconductor layer are alternately stacked.

According to some example embodiments of the inventive concepts, there is provided an IC device including a fin-type active region extending on a substrate in a first lateral direction. A gate line extends on the fin-type active region in a second lateral direction. The second lateral direction intersects the first lateral direction. A channel region is between the substrate and the gate line. A pair of source/drain regions are on both sides of the channel region on the fin-type active region. A superlattice barrier is between the fin-type active region and the channel region. The superlattice barrier is in contact with the pair of source/drain regions. The superlattice barrier has a structure in which a plurality of first sub-layers including a semiconductor layer doped with oxygen atoms and a plurality of second sub-layers including an undoped semiconductor layer are alternately stacked.

According to some example embodiments of the inventive concepts, there is provided an IC device including a fin-type active region extending on a substrate in a first lateral direction. A nanosheet stack is on the fin-type active region. The nanosheet stack includes at least one nanosheet. A gate line surrounds the at least one nanosheet on the fin-type active region. The gate line extending in a second lateral direction. The second lateral direction intersects the first lateral direction. A superlattice barrier is between the fin-type active region and the nanosheet stack. The superlattice barrier includes a recess passing through at least a portion of the superlattice barrier in a vertical direction. A source/drain region is inside the recess and includes a portion in contact with the superlattice barrier and a portion in contact with the at least one nanosheet. The superlattice barrier has a structure in which a plurality of first sub-layers including a semiconductor layer doped with oxygen atoms and a plurality of second sub-layers including an undoped semiconductor layer are alternately stacked.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
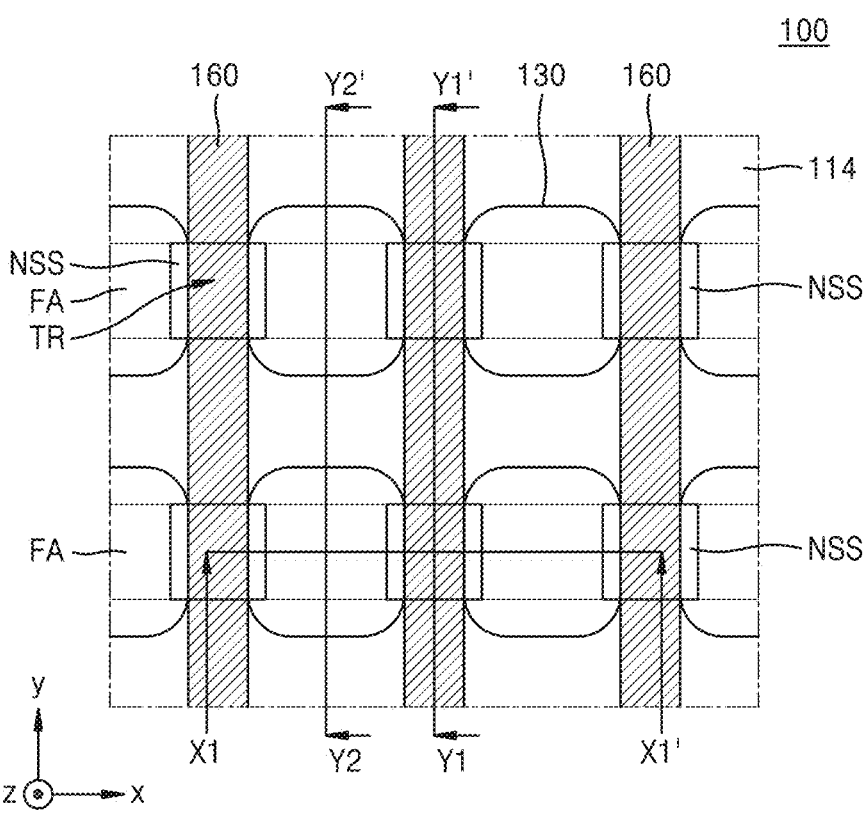
FIG. 1 is a plan layout diagram of some components of an integrated circuit (IC) device 100 according to example embodiments.

Hereinafter, example embodiments will be described in detail with reference to the accompanying drawings. The same reference numerals are used to denote the same elements in the drawings, and repeated descriptions thereof are omitted.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2A:
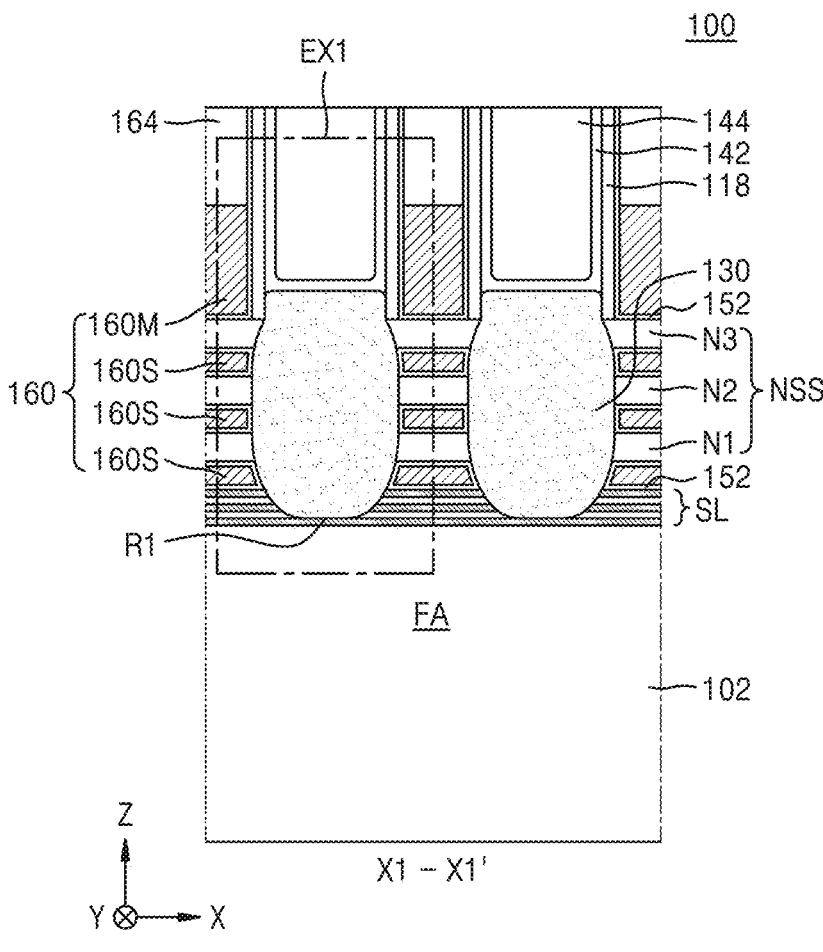
FIG. 2A is a cross-sectional view taken along line X1-X1' of FIG. 1.
Figure 2B:
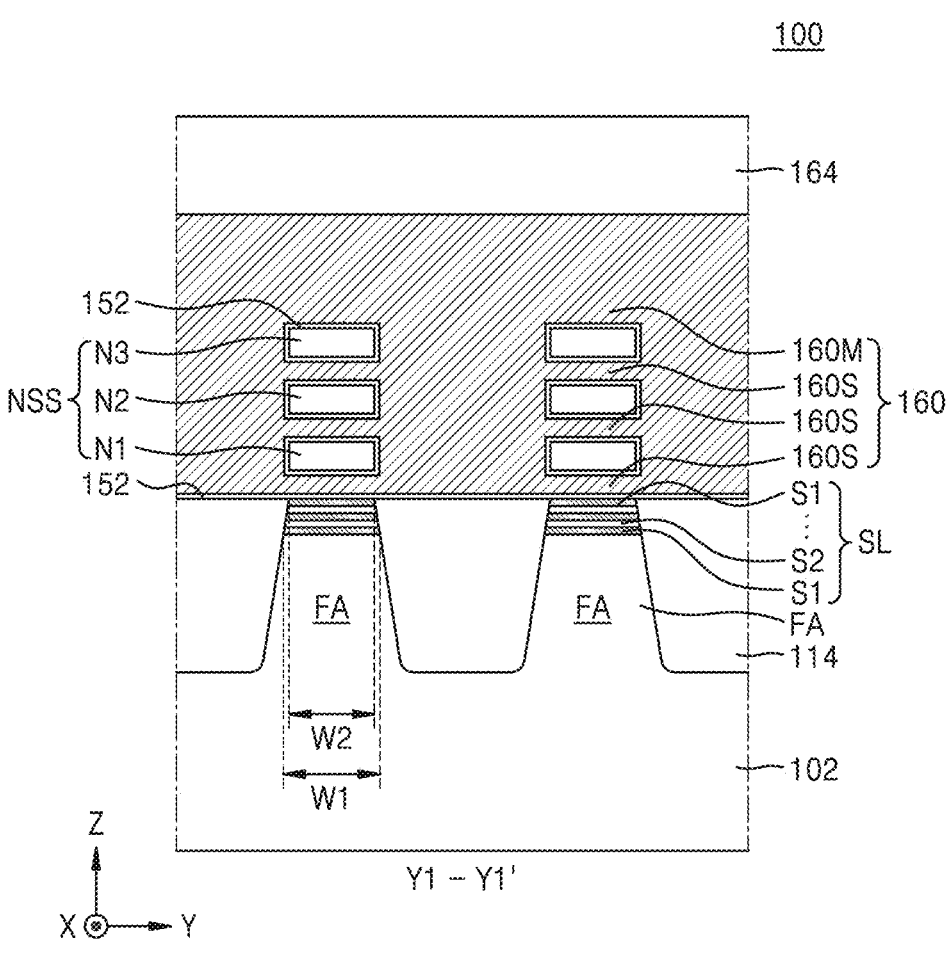
FIG. 2B is a cross-sectional view taken along line Y1-Y1' of FIG. 1.
Figure 2C:
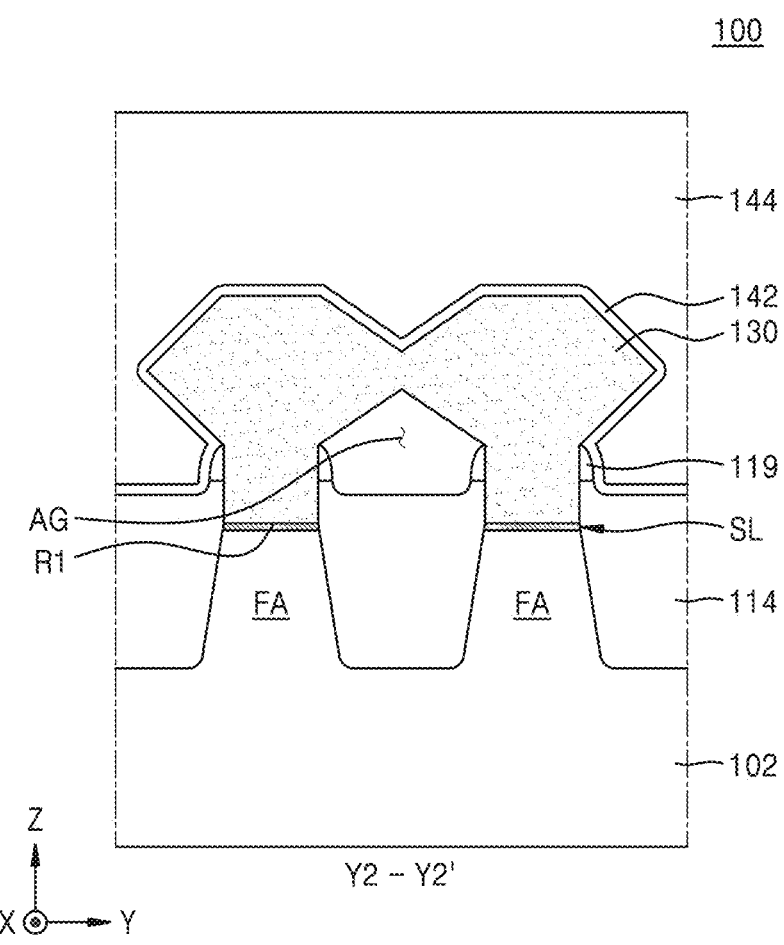
FIG. 2C is a cross-sectional view taken along line Y2-Y2' of FIG. 1.
Figure 2D:
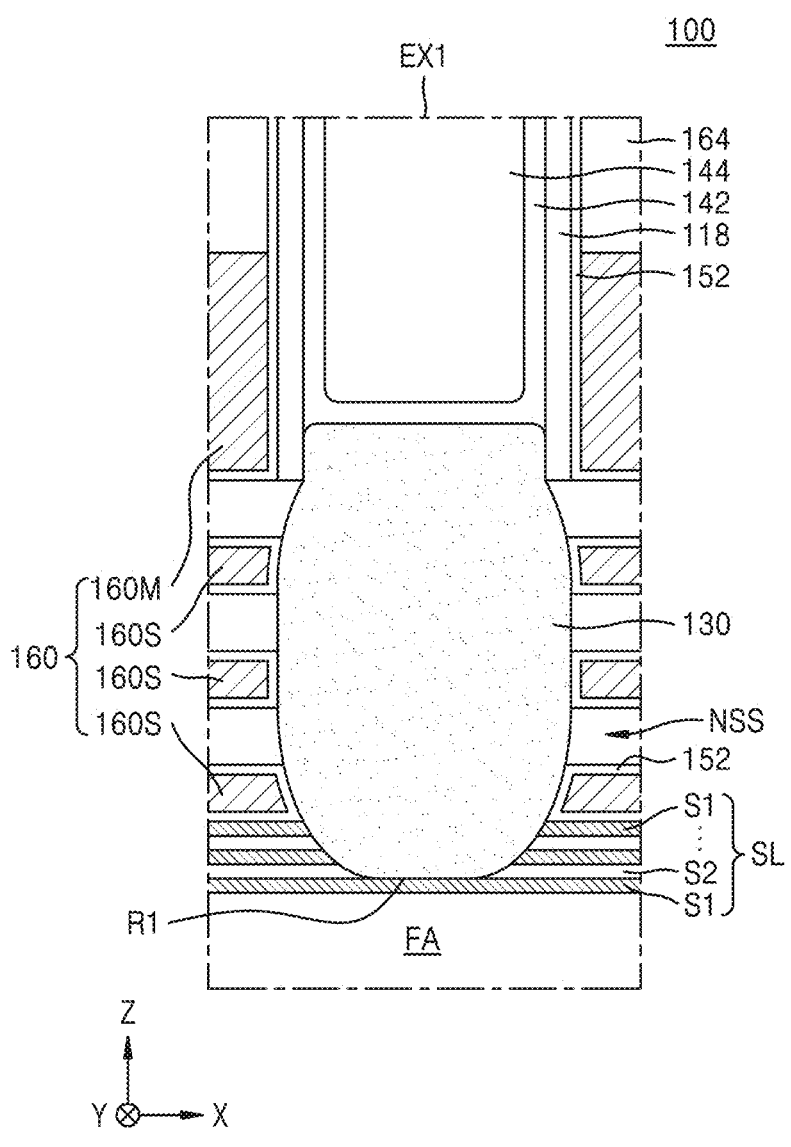
FIG. 2D is an enlarged cross-sectional view of a local region "EX1" of FIG. 2A.

FIG. 1 is a plan layout diagram of some components of an integrated circuit (IC) device 100 according to example embodiments. FIG. 2A is a cross-sectional view taken along line X1-X1' of FIG. 1; FIG. 2B is a cross-sectional view taken along line Y1-Y1' of FIG. 1; FIG. 2C is a cross-sectional view taken along line Y2-Y2' of FIG. 1; and FIG. 2D is an enlarged cross-sectional view of a local region "EX1" of FIG. 2A.

Referring to FIGS. 1 and 2A to 2D, the IC device 100 may include a plurality of fin-type active regions FA and a plurality of nanosheet stacks NSS. The plurality of fin-type active regions FA may protrude from a substrate 102 in a vertical direction (Z direction) and extend long in a first lateral direction (X direction). The plurality of nanosheet stacks NSS may be on the plurality of fin-type active regions FA. As used herein, the term "nanosheet" refers to a conductive structure having cross-section that is substantially perpendicular to a direction in which current flows. The nanosheet should be interpreted as including a nanowire.

The substrate 102 may include a semiconductor, such as silicon (Si) and/or germanium (Ge), and/or a compound semiconductor, such as silicon germanium (SiGe), silicon carbide (SiC), gallium arsenide (GaAs), indium arsenide (InAs), indium gallium arsenide (InGaAs), and/or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A device isolation film (refer to 114 in FIGS. 2B and 2C) may be on the substrate 102 to cover both sidewalls of each or one or more of the plurality of fin-type active regions FA. The device isolation film 114 may include an oxide film, and/or a nitride film, and/or a combination thereof.

A plurality of gate lines 160 may be on the plurality of fin-type active regions FA. Each or one or more of the plurality of gate lines 160 may extend in a second lateral direction (Y direction), which intersects the first lateral direction (X direction). The plurality of nano sheet stacks NSS may be respectively over the plurality of fin-type active regions FA in regions where the plurality of fin-type active regions FA intersect with the plurality of gate lines 160. Each or one or more of the plurality of nanosheet stacks NSS may include a plurality of nanosheets (e.g., N1, N2, and/or N3), which overlap each other in the vertical direction (Z direction) on the fin-type active region FA. The plurality of nanosheets (e.g., N1, N2, and/or N3) may be at different vertical distances (Z-directional distances) from a top surface of the fin-type active region FA. The plurality of nanosheets (e.g., N1, N2, and/or N3) may include a first nanosheet N1, a second nanosheet N2, and/or a third nanosheet N3, which are sequentially stacked on the fin-type active region FA.

A superlattice barrier SL may be between the substrate 102 and the first to third nanosheets N1, N2, and/or N3. The superlattice barrier SL may cover the top surface of the fin-type active region FA. The superlattice barrier SL may have a superlattice structure. As used herein, the term "superlattice structure" refers to a multilayered structure in which different kinds of material layers are alternately stacked one by one and a structure obtained by controlling the thickness of each or one or more of the material layers on an atomic layer level.

As shown in FIGS. 2A and 2B, each or one or more of the plurality of nanosheet stacks NSS may be apart from the superlattice barrier SL in the vertical direction (Z direction) and face the superlattice barrier SL. As shown in FIG. 2B, both sidewalls of the fin-type active region FA and/or both sidewalls of the superlattice barrier SL may be covered by the device isolation film 114 in the second lateral direction (Y direction).

FIG. 1 illustrates a case in which the nanosheet stack NSS has an approximately rectangular planar shape, without being limited thereto. The nanosheet stack NSS may have various planar shapes according to a planar shape of each or one or more of the fin-type active region FA and the gate line 160. The present example embodiment pertains to an example configuration in which the plurality of nanosheet stacks NSS and the plurality of gate lines 160 are formed on one fin-type active region FA, and the plurality of nanosheet stacks NSS are arranged in a line in the first lateral direction (X direction) on one fin-type active region FA. However, according to embodiments, the numbers of nanosheet stacks NSS and/or gate lines 160 on one fin-type active region FA are not specifically limited.

Each or one or more of the first to third nanosheets N1, N2, and/or N3 may have a channel region. For example, each or one or more of the first to third nanosheets N1, N2, and/or N3 may have a thickness selected in a range of about 4 nm to about 6 nm, without being limited thereto. Here, the thickness of each or one or more of the first to third nanosheets N1, N2, and/or N3 refers to a size of each or one or more of the first to third nanosheets N1, N2, and/or N3 in the vertical direction (Z direction). In example embodiments, the first to third nanosheets N1, N2, and/or N3 may have substantially the same thickness in the vertical direction (Z direction). In other example embodiments, at least some of the first to third nanosheets N1, N2, and/or N3 may have different thicknesses in the vertical direction (Z direction).

In example embodiments, as shown in FIG. 2A, at least some of the first to third nanosheets N1, N2, and/or N3 included in one nanosheet stack NSS may have different sizes in the first lateral direction (X direction). In other example embodiments, unlike shown in FIG. 2A, at least some of the first to third nanosheets N1, N2, and/or N3 may have the same size in the first lateral direction (X direction).

A plurality of recesses R1 may be formed on the fin-type active region FA. As shown in FIG. 2A, each or one or more of the plurality of recesses R1 may pass through a portion of the superlattice barrier SL in the vertical direction (Z direction). A lowermost surface of each or one or more of the plurality of recesses R1 may be at a higher level than a bottom surface of the superlattice barrier SL and at a lower level than a top surface of the superlattice barrier SL. As used herein, the term "level" refers to a height from a top surface of the substrate 102 in a vertical direction (Z direction or −Z direction).

A plurality of source/drain regions 130 may be respectively inside the plurality of recesses R1. Each or one or more of the plurality of source/drain regions 130 may have sidewalls facing the first to third nanosheets N1, N2, and N3 included in the nanosheet stack NSS adjacent thereto. Each or one or more of the plurality of source/drain regions 130 may be in contact with the first to third nanosheets N1, N2, and/or N3 included in the nanosheet stack NSS adjacent thereto.

The plurality of source/drain regions 130 may include an epitaxially grown semiconductor layer. In example embodiments, the plurality of source/drain regions 130 may include a Group-IV element semiconductor, a Group IV-IV compound semiconductor, or a combination thereof. In example embodiments, each or one or more of the plurality of source/drain regions 130 may include a silicon layer doped with an n-type dopant, a silicon carbide (SiC) layer doped with an n-type dopant, or a silicon germanium (SiGe) layer doped with a p-type dopant. The n-type dopant may be selected from phosphorus (P), arsenic (As), and/or antimony (Sb). The p-type dopant may be selected from boron (B) and/or gallium (Ga).

A plurality of gate lines 160 may surround each or one or more of the first to third nanosheets N1, N2, and/or N3 while covering the nanosheet stack NSS on the superlattice barrier SL. Each or one or more of the plurality of gate lines 160 may include a main gate portion 160M and/or a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively arranged between the first to third nanosheets N1, N2, and/or N3 and/or between the first nanosheet N1 and the superlattice barrier SL. In the vertical direction (Z direction), a thickness of each or one or more of the plurality of sub-gate portions 160S may be less than a thickness of the main gate portion 160M.

The gate line 160 may include a metal, a metal nitride, and/or a metal carbide, and/or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and/or palladium (Pd). The metal nitride may be selected from titanium nitride (TiN) and/or tantalum nitride (TaN). The metal carbide may include titanium aluminum carbide (TiAlC). However, a material included in the gate line 160 is not limited to the examples described above.

A gate dielectric film 152 may be between the nanosheet stack NSS and the gate line 160. In example embodiments, the gate dielectric film 152 may have a stack structure of an interface film and/or a high-k dielectric film. The interface film may include a low-k dielectric material film (e.g., a silicon oxide film, and/or a silicon oxynitride film, and/or a combination thereof), which has a dielectric constant of about 9 or less. In example embodiments, the interface film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

A plurality of nanosheet transistors TR may be formed in regions where the plurality of fin-type active regions FA intersect with the plurality of gate lines 160 on the substrate 102.

In example embodiments, the first to third nanosheets N1, N2, and/or N3 may include a semiconductor layer including the same elements. In an example, each or one or more of the first to third nanosheets N1, N2, and/or N3 may include a silicon layer. In example embodiments, the first to third nanosheets N1, N2, and/or N3 may include an undoped silicon layer. In other example embodiments, the first to third nanosheets N1, N2, and/or N3 may include a silicon layer doped with a dopant of the same conductivity type as that of the source/drain region 130. In other example embodiments, the first to third nanosheets N1, N2, and/or N3 may include a silicon layer doped with a dopant of a conductivity type opposite to that of the source/drain region 130.

As shown in FIG. 2D, the superlattice barrier SL may have a structure in which a plurality of first sub-layers S1 including a semiconductor layer doped with oxygen atoms and a plurality of second sub-layers S2 including an undoped semiconductor layer are alternately stacked one by one. As shown in FIG. 2A, on the fin-type active region FA, the superlattice barrier SL may continuously extend in the first lateral direction (X direction).

Each or one or more of the plurality of source/drain regions 130 may include a portion in contact with the superlattice barrier SL. The superlattice barrier SL may surround a lowermost surface of each or one or more of the plurality of source/drain regions 130, and the lowermost surface of each or one or more of the plurality of source/drain regions 130 may be in contact with a selected one of the plurality of first sub-layers S1 and the plurality of second sub-layers S2, which are included in the superlattice barrier SL. As shown in FIGS. 2A and 2D, the lowermost surface of the source/drain region 130 may be in contact with a selected one of the plurality of first sub-layers S1 included in the superlattice barrier SL. FIGS. 2A and 2D illustrate a configuration in which the lowermost surface of the source/drain region 130 is in contact with a lowermost one of the plurality of first sub-layers S1 included in the superlattice barrier SL, but the inventive concepts are not limited thereto. For example, the lowermost surface of the source/drain region 130 may be in contact with one of the plurality of first sub-layers S1 included in the superlattice barrier SL other than the lowermost one thereof.

As shown in FIGS. 2A, 2B, and 2D, the gate dielectric film 152 may include a first portion in contact with a bottom surface of a lowermost one of the plurality of sub-gate portions 160S, which forms a lowermost surface of the gate line 160. An uppermost surface of the superlattice barrier SL may be in contact with the first portion of the gate dielectric film 152.

Each or one or more of the plurality of first sub-layers 51 and/or the plurality of second sub-layers S2, which constitute the superlattice barrier SL, may include a material selected from a Group IV element semiconductor, a Group IV-IV compound semiconductor, a Group III-V compound semiconductor, a Group II-VI compound semiconductor, and/or a Group IV-VI compound semiconductor.

In example embodiments, each or one or more of the plurality of first sub-layers 51 and/or the plurality of second sub-layers S2 may include a Group IV element semiconductor (e.g., silicon (Si) and/or germanium (Ge)). From the plurality of first sub-layers 51 and the plurality of second sub-layers S2, only the plurality of first sub-layers S1 may further include an oxygen atom dopant.

In an example, each or one or more of the plurality of first sub-layers 51 and/or the plurality of second sub-layers S2 may include an undoped silicon layer. From among the plurality of first sub-layers S1 and the plurality of second sub-layers S2, only the plurality of first sub-layers S1 may further include an oxygen atom dopant. In another example, each or one or more of the plurality of first sub-layers 51 and/or the plurality of second sub-layers S2 may include a silicon doped with an n-type dopant or a p-type dopant. From among the plurality of first sub-layers 51 and the plurality of second sub-layers S2, only the plurality of first sub-layers S1 may further include an oxygen atom dopant.

In still another example, each or one or more of the plurality of first sub-layers 51 and the plurality of second sub-layers S2 may include an undoped SiGe layer, a SiGe layer doped with an n-type dopant, or a SiGe layer doped with a p-type dopant. From among the plurality of first sub-layers 51 and the plurality of second sub-layers S2, only the plurality of first sub-layers S1 may further include an oxygen atom dopant. When at least one of the plurality of first sub-layers 51 and the plurality of second sub-layers S2 includes a SiGe layer, the SiGe layer may have a Ge concentration of about 50 atomic percent (at %) or less.

In other example embodiments, each or one or more of the plurality of first sub-layers 51 and the plurality of second sub-layers S2 may include a compound semiconductor selected from a Group IV-IV compound semiconductor, a Group III-V compound semiconductor, a Group II-VI compound semiconductor, and/or a Group IV-VI compound semiconductor. From among the plurality of first sub-layers 51 and the plurality of second sub-layers S2, only the plurality of first sub-layers S1 may further include an oxygen atom dopant.

The Group IV-IV compound semiconductor may be selected from silicon germanium (SiGe), silicon carbide (SiC), silicon germanium carbide (SiGeC), germanium tin (GeSn), silicon tin (SiSn), and/or silicon germanium tin (SiGeSn). The Group III-V compound semiconductor may include a compound semiconductor including at least one element of indium (In), gallium (Ga), and aluminum (Al) as a Group III element and at least one of arsenic (As), phosphorus (P), and/or antimony (Sb) as a Group V element. The Group III-V compound semiconductor may include a binary, ternary, or quaternary compound including two, three, or four elements selected from the Groups III and/or V in the Mendeleev periodic table. The binary compound may be selected from indium phosphide (InP), gallium arsenide (GaAs), gallium phosphide (GaP), indium arsenide (InAs), indium antimonide (InSb), and/or gallium antimonide (GaSb), and/or the ternary compound may be selected from indium gallium phosphide (InGaP), indium gallium arsenide (InGaAs), aluminum indium arsenide (AlInAs), indium gallium antimonide (InGaSb), gallium arsenic antimonide (GaAsSb), and/or gallium arsenic phosphide (GaAsP), without being limited thereto. The Group II-VI compound semiconductor may include a binary, ternary, or quaternary compound including two, three, or four elements selected from the Groups II and/or VI in the Mendeleev periodic table. The Group II-VI compound semiconductor may be selected from cadmium selenide (CdSe), zinc telluride (ZnTe), cadmium sulfide (CdS), zinc sulfide (ZnS), zinc selenide (ZnSe), and/or mercury cadmium telluride (HgCdTe), without being limited thereto. The Group IV-VI compound semiconductor may include PbS, without being limited thereto. Although examples of specific materials of each of the Group IV-IV compound semiconductor, the Group III-V compound semiconductor, the Group II-VI compound semiconductor, and the Group IV-VI compound semiconductor have been described above, each of the specific materials of the compound semiconductors described above refers to a material including elements included therein, without referring to a chemical formula representing a stoichiometric relationship.

In still other example embodiments, the plurality of first sub-layers S1 and the plurality of second sub-layers S2 may include the same Group IV-IV compound semiconductor layer. At least some of the plurality of first sub-layers S1 and/or the plurality of second sub-layers S2 may include Group IV-IV compound semiconductor layers having different compositions. In an example, each or one or more of the plurality of first sub-layers S1 and/or the plurality of second sub-layers S2 may include a $Si_{1-x}Ge_x$ (0<x<1), and a Ge content (x value) of the plurality of first sub-layers S1 may be different from a Ge content (x value) of the plurality of second sub-layers S2. For example, the plurality of first sub-layers S1 may include a $Si_{1-x}Ge_x$ (0<x<1) layer doped with oxygen atoms, and the plurality of second sub-layers S2 may include an undoped $Si_{1-x}Ge_x$ (0<x<1) layer. Here, a Ge content (x value) of the plurality of first sub-layers S1 may be less than a Ge content (x value) of the plurality of second sub-layers S2.

In still other example embodiments, the plurality of first sub-layers S1 and the plurality of second sub-layers S2 may include the same Group III-V compound semiconductor layer, and at least some of the plurality of first sub-layers S1 and/or the plurality of second sub-layers S2 may include Group III-V compound semiconductor layers having different compositions. In an example, each or one or more of the plurality of first sub-layers S1 and/or the plurality of second sub-layers S2 may include $In_{1-y}Ga_yAs$ (0<y<1). A Ga content (y value) of the plurality of first sub-layers S1 may be different from a Ga content (y value) of the plurality of second sub-layers S2). For example, the plurality of first sub-layers S1 may include an $In_{1-y}Ga_yAs$ (0<y<1) layer doped with oxygen atoms, and the plurality of second sub-layers S2 may include an undoped $In_{1-y}Ga_yAs$ (0<y<1) layer. Here, the Ga content (y value) of the plurality of first sub-layers S1 may be less than the Ga content (y value) of the plurality of second sub-layers S2.

In the IC device 100 shown in FIGS. 2A to 2D, the superlattice barrier SL may be illustrated as including three first sub-layers S1, which are apart from each other with one second sub-layer S2 therebetween, but the inventive concepts are not limited to the example shown in FIGS. 2A to 2D. The numbers of first sub-layers S1 and/or second sub-layers S2, which are alternately arranged in the superlattice barrier SL, may be variously selected as needed or desired. In example embodiments, the superlattice barrier SL may include about three to ten pairs of first sub-layer S1 and second sub-layer S2, without being limited thereto.

As shown in FIG. 2B, in the second lateral direction (Y direction), at least some of the plurality of first sub-layers S1 and/or the plurality of second sub-layers S2, which are included in the superlattice barrier SL, may have different widths. In example embodiments, the plurality of first sub-layers S1 and the plurality of second sub-layers S2, which are included in the superlattice barrier SL, may have gradually increased widths in the second lateral direction (Y direction) toward the fin-type active region FA. For example, in the superlattice barrier SL, a first width W1 of the first sub-layer S1, which is closest to the fin-type active region FA, in the second lateral direction (Y direction) may be greater than a second width W2 of the first sub-layer S1, which is farthest from the fin-type active region FA, in the second lateral direction (Y direction).

In example embodiments, each or one or more of the plurality of first sub-layers S1 and/or plurality of second sub-layers S2, which are included in the superlattice barrier SL, may have a thickness of about 1 nm to about 10 nm, without being limited thereto. In example embodiments, the plurality of first sub-layers S1 and the plurality of second sub-layers S2 may have the same thickness. In other example embodiments, at least some of the plurality of first sub-layers S1 and/or the plurality of second sub-layers S2 may have different thicknesses. In example embodiments, the superlattice barrier SL may have a thickness of about 5 nm to about 100 nm, without being limited thereto. As used herein, the thickness of each of the superlattice barrier SL, the first sub-layer S1, and/or the second sub-layer S2 refers to a size of each of the superlattice barrier SL, the first sub-layer S1, and the second sub-layer S2 in the vertical direction (Z direction).

In the IC device 100 shown in FIGS. 2A to 2D, the superlattice barrier SL may be illustrated as a structure that starts with the first sub-layer S1, which is at a lower side closest to the substrate 102, and ends with the first sub-layer 152, which is in contact with the gate dielectric film 152, but the inventive concepts are not limited to the example shown in FIGS. 2A to 2D. The superlattice barrier SL may start or end with a selected one of the first sub-layer 51 and the second sub-layer S2. The superlattice barrier SL may include an incomplete pair of the first sub-layer 51 and the second sub-layer S2.

In the IC device 100, the superlattice barrier SL may control each or one or more of the plurality of source/drain regions 130 to have a constant size in the vertical direction (Z direction). For example, a size of each or one or more of the plurality of source/drain regions 130 in the vertical direction (Z direction) may be easily controlled by the plurality of first sub-layers S1 included in the superlattice barrier SL. Accordingly, a problem due to deterioration in size distribution of the plurality of source/drain regions 130 may be reduced or prevented by the superlattice barrier SL.

In addition, in the IC device 100, the superlattice barrier SL may contribute toward obtaining the plurality of source/drain regions 130, which are free of, or contain fewer, voids and/or defects, during the process of forming the plurality of source/drain regions 130. More specifically, while a semiconductor material included in the source/drain region 130 is being epitaxially grown from surfaces of the plurality of recesses R1, a semiconductor material may be uniformly epitaxially grown from not only respective surfaces of the first to third nanosheets N1, N2, and/or N3, which are exposed at the plurality of recesses R1, but also respective surfaces of the plurality of first sub-layers S1 and/or the plurality of second sub-layers S2. Thus, the source/drain regions 130 of high quality may be obtained which are free of, or contain fewer, voids and/or defects.

In addition, in the IC device 100, because the uppermost surface of the superlattice barrier SL is in contact with the gate dielectric film 152, a leakage current may be reduced or prevented from being generated under the sub-gate portion 160S, which is closest to the fin-type active region FA, from among the plurality of sub-gate portions 160S. Furthermore, a punchthrough through the fin-type active region FA may be effectively blocked by the superlattice barrier SL under the nanosheet stack NSS, and thus, the deterioration of electrical characteristics may be reduced or suppressed.

In example embodiments, an oxygen atom doping concentration of the plurality of first sub-layers S1 included in the superlattice barrier SL may be selected in a range of about $1E19/cm^3$ to about $5E20/cm^3$. When the oxygen atom doping concentration of the plurality of first sub-layers S1 is excessively low, an effect of reducing or suppressing a leakage current by the superlattice barrier SL may be reduced in the nanosheet transistor TR. When the oxygen atom doping concentration of the plurality of first sub-layers S1 is excessively high, defects may occur in the plurality of source/drain regions 130 during the process of forming the plurality of source/drain regions 130.

In example embodiments, in each or one or more of the plurality of first sub-layers S1 included in the superlattice barrier SL, an oxygen atom doping concentration may be uniform according to a position of each or one or more of the plurality of first sub-layers S1. In other example embodiments, in each or one or more of the plurality of first sub-layers S1 included in the superlattice barrier SL, an oxygen atom doping concentration may be non-uniform according to a position of each or one or more of the plurality of first sub-layers S1 in a lateral direction. For example, each or one or more of the plurality of first sub-layers S1 may include a plurality of locally doped regions doped with oxygen atoms and/or a plurality of locally undoped regions, which are not doped with the oxygen atoms. In each or one or more of the plurality of first sub-layers S1, the plurality of locally doped regions may intermittently extend in a lateral direction.

As shown in FIGS. 2A, 2B, and 2D, a top surface of the gate line 160 may be covered by a capping insulating pattern 164. The capping insulating pattern 164 may include a silicon nitride film. A plurality of outer insulating spacers 118 may be on the fin-type active region FA and/or the device isolation film 114 to cover both sidewalls of each or one or more of the gate line 160 and the capping insulating pattern 164. The plurality of outer insulating spacers 118 may cover both sidewalls of the main gate portion 160M and/or the capping insulating pattern 164 on top surfaces of the plurality of nanosheet stacks NSS. Each or one or more of the plurality of outer insulating spacers 118 may be apart from the gate line 160 with the gate dielectric film 152 therebetween.

As shown in FIG. 2C, a plurality of recess-side insulating spacers 119 may be on a top surface of the device isolation film 114 to cover sidewalls of the source/drain region 130. In example embodiments, each or one or more of the plurality of recess-side insulating spacers 119 may be integrally connected to the outer insulating spacer 118 adjacent thereto. An air gap AG may be in a space defined by the recess-side insulating spacer 119 and the source/drain region 130 and the device isolation film 114, which are adjacent to the recess-side insulating spacer 119.

Each or one or more of the plurality of outer insulating spacers 118 and the plurality of recess-side insulating spacers 119 may include silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), and/or silicon oxycarbide (SiOC), and/or a combination thereof. As used herein, each of the terms "SiN," "SiO," "SiCN," "SiBN," "SiON," "SiOCN," "SiBCN," and "SiOC" refers to a material including elements included therein, without referring to a chemical formula representing a stoichiometric relationship As shown in FIGS. 2A and 2D, each or one or more of the plurality of source/drain regions 130 may include a portion, which overlaps the outer insulating spacer 118 in the vertical direction (Z direction). For example, a portion of each or one or more of the plurality of source/drain regions 130, which overlaps the outer insulating spacer 118 in the vertical direction (Z direction), may have a width ranging from about 0 nm to about 4 nm in the first lateral direction (X direction), without being limited thereto.

Between the first to third nanosheets N1, N2, and/or N3 and/or between the first nanosheet N1 and the superlattice barrier SL, both sidewalls of each or one or more of the plurality of sub-gate portions 160S may be apart from the source/drain region 130 with the gate dielectric film 152 therebetween. The gate dielectric film 152 may include a portion in contact with the source/drain region 130. Each or one or more of the plurality of source/drain regions 130 may face the nanosheet stack NSS, the plurality of sub-gate portions 160S, and/or the superlattice barrier SL in the first lateral direction (X direction).

As shown in FIGS. 2A, 2C, and 2D, the plurality of outer insulating spacers 118 and/or the plurality of source/drain regions 130 may be covered by an insulating liner 142. The insulating liner 142 may include SiN, SiO, SiCN, SiBN, SiON, SiOCN, SiBCN, and/or SiOC, and/or a combination thereof. In example embodiments, the insulating liner 142 may be omitted. An inter-gate dielectric film 144 may be on the insulating liner 142. The inter-gate dielectric film 144 may include a silicon nitride film, a silicon oxide film, SiON, and/or SiOCN, and/or a combination thereof. When the insulating liner 142 is omitted, the inter-gate dielectric film 144 may be in contact with the plurality of source/drain regions 130.

In the IC device 100, a size of the plurality of source/drain regions 130 in the vertical direction (Z direction) may be uniformly controlled by the plurality of first sub-layers S1 included in the superlattice barrier SL. Accordingly, the plurality of source/drain regions 130 included in the plurality nanosheet transistors TR may have a uniformly controlled shape. Thus, the distribution of electrical characteristics of the plurality of source/drain regions 130 may be improved.

Furthermore, in the IC device 100, the superlattice barrier SL may have a structure in which the plurality of first sub-layers S1 including a semiconductor layer doped with oxygen atoms and the plurality of second sub-layers S2 including an undoped semiconductor layer are alternately stacked one by one. Thus, during the formation of the plurality of source/drain regions 130, while a semiconductor material is being epitaxially grown from surfaces of the first to third nanosheets N1, N2, and/or N3, which are exposed inside the plurality of recesses R1, a semiconductor material may be epitaxially grown from surfaces of the plurality of first sub-layers S1 and/or the plurality of second sub-layers S2, which are exposed at respective lower sides of the plurality of recesses R1. Accordingly, the plurality of source/drain regions 130 of high quality may be obtained without causing voids or defects, and contact resistances of the plurality of source/drain regions 130 may be reduced. Accordingly, electrical characteristics of each or one or more of the plurality of nanosheet transistors TR including the plurality of source/drain regions 130 may be improved.

Furthermore, in the IC device 100, an uppermost surface of the superlattice barrier SL may be in contact with the gate dielectric film 152. Accordingly, an undesired leakage current may be reduced or prevented from being generated under the sub-gate portion 160S closest to the fin-type active region FA, from among the plurality of sub-gate portions 160S.

Figure 3A:
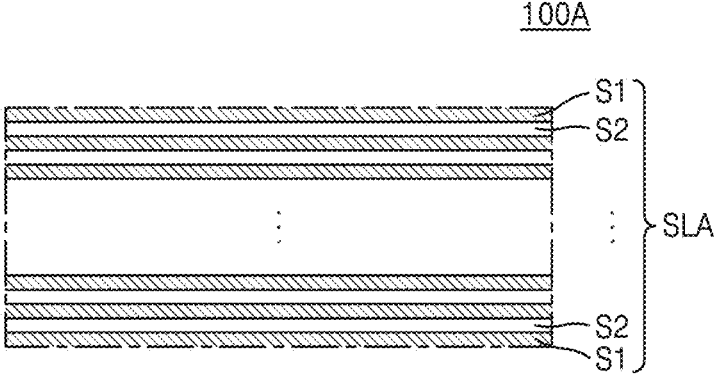
FIGS. 3A and 3B are cross-sectional views of IC devices according to example embodiments.

FIG. 3A is a cross-sectional view of an IC device 100A according to example embodiments. Referring to FIG. 3A, the IC device 100A may have substantially the same configuration as the IC device 100 described with reference to FIGS. 1 and 2A to 2D. However, the IC device 100A may include a superlattice barrier SLA instead of the superlattice barrier SL.

The superlattice barrier SLA may have a structure in which a plurality of first sub-layers Si including a semiconductor layer doped with oxygen atoms and a plurality of second sub-layers S2 including an undoped semiconductor layer are alternately stacked one by one. Detailed configurations of the plurality of first sub-layers S1 and the plurality of second sub-layers S2 included in the superlattice barrier SLA are substantially the same as those described with reference to FIGS. 2A to 2D. In the superlattice barrier SLA, the number of pairs of first sub-layer Si and second sub-layer S2 is not specifically limited. For example, the superlattice barrier SLA may include at least 10 pairs (e.g., about 10 to 100 pairs) of first sub-layer Si and second sub-layer S2. In example embodiments, the superlattice barrier SLA may have a thickness of about 300 nm or less, for example, a thickness of about 20 nm to about 200 nm.

Figure 3B:
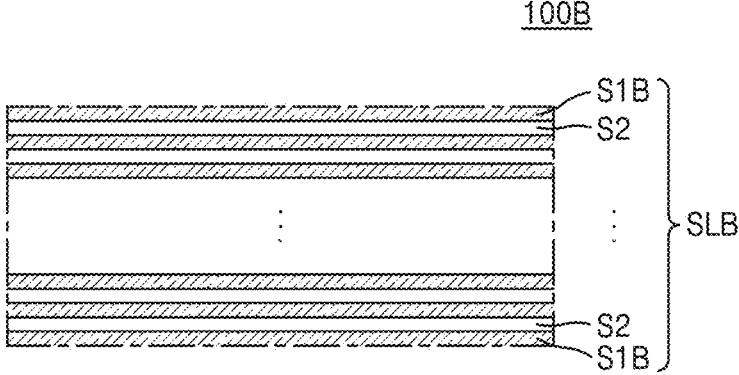

FIG. 3B is a cross-sectional view of an IC device 100B according to example embodiments. Referring to FIG. 3B, the IC device 100B may have substantially the same configuration as the IC device 100A described with reference to FIG. 3A. However, the IC device 100B may include a superlattice barrier SLB instead of the superlattice barrier SLA.

The superlattice barrier SLB may have a structure in which a plurality of first sub-layers S1B including a semiconductor layer doped with oxygen atoms and a plurality of second sub-layers S2 including an undoped semiconductor layer are alternately stacked one by one. An oxygen atom doping concentration of each or one or more of the plurality of first sub-layers S1B may be selected in a range of about $1E^{19}/cm^3$ to about $5E^{20}/cm^3$. In example embodiments, the oxygen atom doping concentration of each or one or more of the plurality of first sub-layers S1B may be non-uniform according to a position of each or one or more of the plurality of first sub-layers S1B. For example, each or one or more of the plurality of first sub-layers S1B may include a plurality of locally doped regions doped with oxygen atoms and/or a plurality of locally undoped regions, which are not doped with the oxygen atoms. The plurality of locally doped regions may be apart from each other with the locally undoped regions therebetween. In each or one or more of the plurality of first sub-layers S1B, the plurality of locally doped regions may intermittently extend in a lateral direction.

Figure 4:
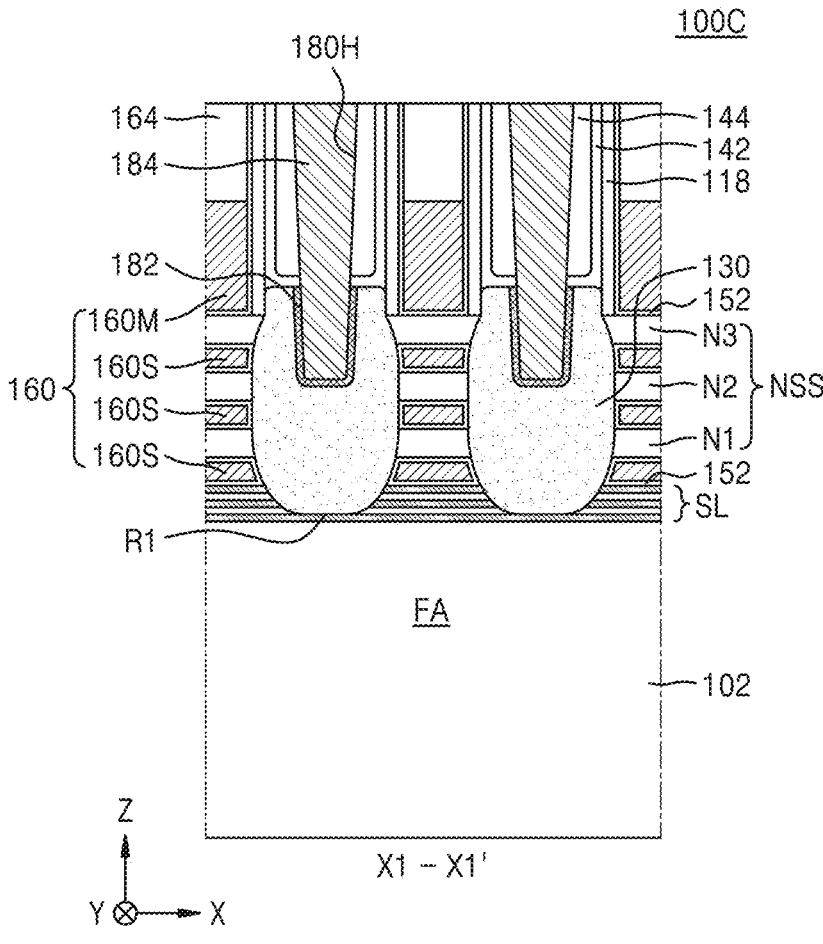
FIGS. 4 to 15 are cross-sectional views of an IC device, according to example embodiments.

FIG. 4 is a cross-sectional view of an IC device 100C according to example embodiments. FIG. 4 illustrates some components in a portion corresponding to a cross-section taken along line X1-X1' of FIG. 1.

Referring to FIG. 4, the IC device 100C may have substantially the same configuration as the IC device 100 described with reference to FIGS. 1 and 2A to 2D. However, the IC device 100C may further include a plurality of source/drain contacts 184 on a plurality of source/drain regions 130. A metal silicide film 182 may be between the source/drain region 130 and the source/drain contact 184. Each or one or more of the plurality of source/drain contacts 184 may fill a contact hole 180H, which passes through an inter-gate dielectric film 144 and an insulating liner 142 in a vertical direction (Z direction) and extends into the source/drain region 130. The source/drain region 130 may be apart from the source/drain contact 184 with the metal silicide film 182 therebetween. The source/drain region 130 may surround a lower portion of each or one or more of the plurality of the source/drain contacts 184 outside the contact hole 180H.

The metal silicide film 182 may include titanium silicide, without being limited thereto. In some example embodiments, the metal silicide film 182 may be omitted. Each or one or more of the plurality of source/drain contacts 184 may include a metal, and/or a conductive metal nitride, and/or a combination thereof. For example, each or one or more of the plurality of source/drain contacts 184 may include tungsten (W), copper (Cu), aluminum (Al), titanium (Ti), tantalum (Ta), titanium nitride (TiN), tantalum nitride (TaN), and/or an alloy thereof, and/or a combination thereof.

Figure 5:
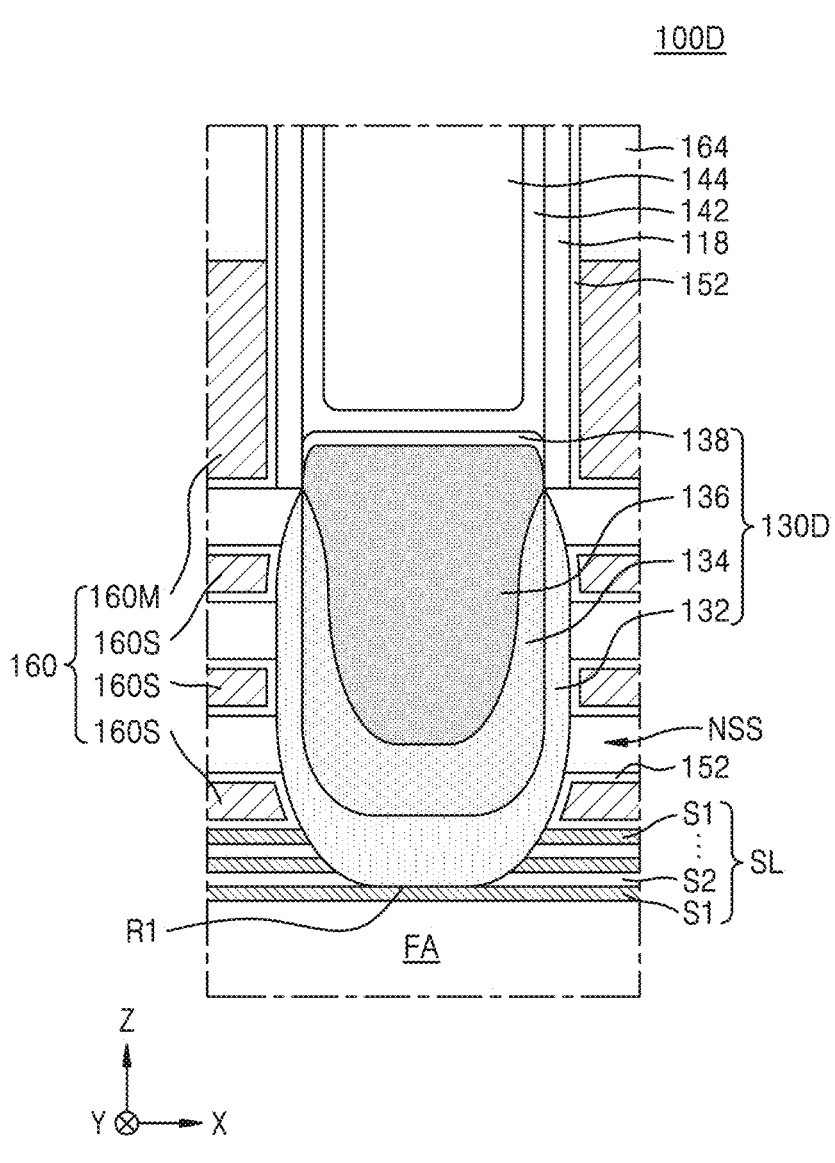

FIG. 5 is a cross-sectional view of an IC device 100D according to example embodiments. FIG. 5 illustrates an enlarged cross-sectional configuration of a region corresponding to the local region "EX1" of FIG. 2A.

Referring to FIG. 5, the IC device 100D may have substantially the same configuration as the IC device 100 described with reference to FIGS. 1 and 2A to 2D. However, the IC device 100D may include a source/drain region 130D instead of a source/drain region 130.

The source/drain region 130D may have substantially the same configuration as the source/drain region 130 described with reference to FIGS. 1 and 2A to 2D. However, the source/drain region 130D may include a first main body layer 132, a second main body layer 134, a third main body layer 136, and/or a capping layer 138, which are sequentially stacked on a first sub-layer S1 of the superlattice barrier SL in a vertical direction (Z direction).

In example embodiments, each or one or more of the first main body layer 132, the second main body layer 134, and/or the third main body layer 136 may include a $Si_{1-x}Ge_x$ layer (here, $0.15 \leq x < 0.7$), which is doped with a p-type dopant. Here, a Ge concentration of the second main body layer 134 may be higher than a Ge concentration of the first main body layer 132, and a Ge concentration of the third main body layer 136 may be higher than the Ge concentration of the second main body layer 134. In example embodiments, the Ge concentration of the first main body layer 132 may be selected in a range of about 0.15 at % to about 0.30 at %, the Ge concentration of the second main body layer 134 may be selected in a range of about 0.30 at % to about 0.50 at %, and/or the Ge concentration of the third main body layer 136 may be selected in a range of about 0.50 at % to about 0.70 at %, but the inventive concepts are not limited thereto. In example embodiments, the p-type dopant may include at least one selected from boron (B) and/or gallium (Ga), without being limited thereto.

The capping layer 138 may cover a top surface of the third main body layer 136 at a higher level than a top level of the nanosheet stack NSS in the vertical direction (Z direction). In example embodiments, the capping layer 138 may have a thickness of about 0.1 nm to about 10 nm. In example embodiments, the capping layer 138 may include an undoped silicon layer. In other example embodiments, the capping layer 138 may include a silicon doped with a p-type dopant selected from boron (B) and/or gallium (Ga). For instance, the capping layer 138 may include a silicon layer doped with boron (B). The capping layer 138 may not include a Ge element. The capping layer 138 may protect the first main body layer 132, the second main body layer 134 and/or the third main body layer 136. For example, the capping layer 138 may reduce or prevent chemicals and/or external shocks from being transmitted from the outside to the first main body layer 132, the second main body layer 134, and/or the third main body layer 136.

Figure 6:
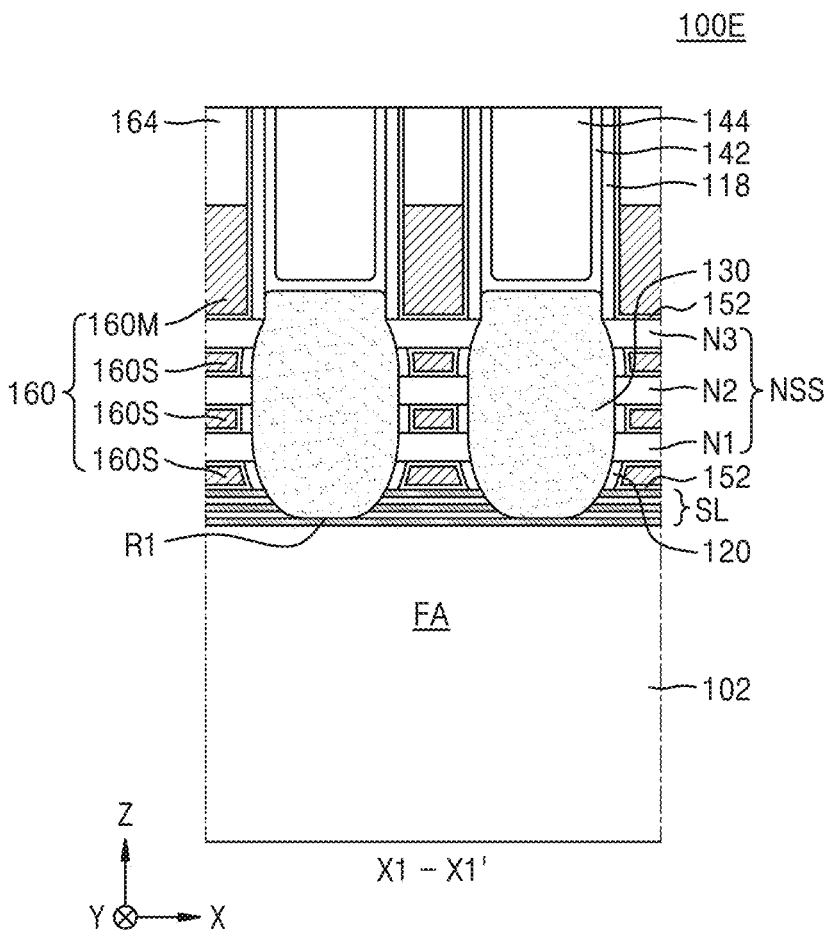

FIG. 6 is a cross-sectional view of an IC device 100E according to example embodiments. FIG. 6 illustrates some components in a portion corresponding to a cross-section taken along line X1-X1' of FIG. 1.

Referring to FIG. 6, the IC device 100E may have substantially the same configuration as the IC device 100 described with reference to FIGS. 1 and 2A to 2D. However, the IC device 100E may further include a plurality of inner insulating spacers 120, which are interposed between the first to third nanosheets N1, N2, and/or N3 and/or between the first nanosheet N1 and a superlattice barrier SL and, also, interposed between a plurality of sub-gate portions 160S and source/drain regions 130.

Both sidewalls of each or one or more of the plurality of sub-gate portions 160S may be covered with the inner insulating spacers 120 with a gate dielectric film 152 therebetween. Each or one or more of the plurality of sub-gate portions 160S may be apart from the source/drain region 130 with the gate dielectric film 152 and/or the inner insulating spacers 120 therebetween. Each or one or more of the plurality of inner insulating spacers 120 may be in contact with the source/drain region 130. At least some of the plurality of inner insulating spacers 120 may overlap an outer insulating spacer 118 in the vertical direction (Z direction).

The plurality of inner insulating spacers 120 may include silicon nitride, silicon oxide, SiCN, SiBN, SiON, SiOCN, SiBCN, and/or SiOC, and/or a combination thereof. In example embodiments, at least some of the plurality of inner insulating spacers 120 may further include an air gap. In example embodiments, the inner insulating spacer 120 may include the same material as the outer insulating spacer 118. In other example embodiments, the outer insulating spacer 118 and the inner insulating spacer 120 may include different materials.

Each or one or more of the plurality of source/drain regions 130 may face a plurality of sub-gate portions 160S with the inner insulating spacer 120 and/or the gate dielectric film 152 therebetween in the first lateral direction (X direction). The plurality of source/drain regions 130 may not include a portion in contact with the gate dielectric film 152.

Figure 7:
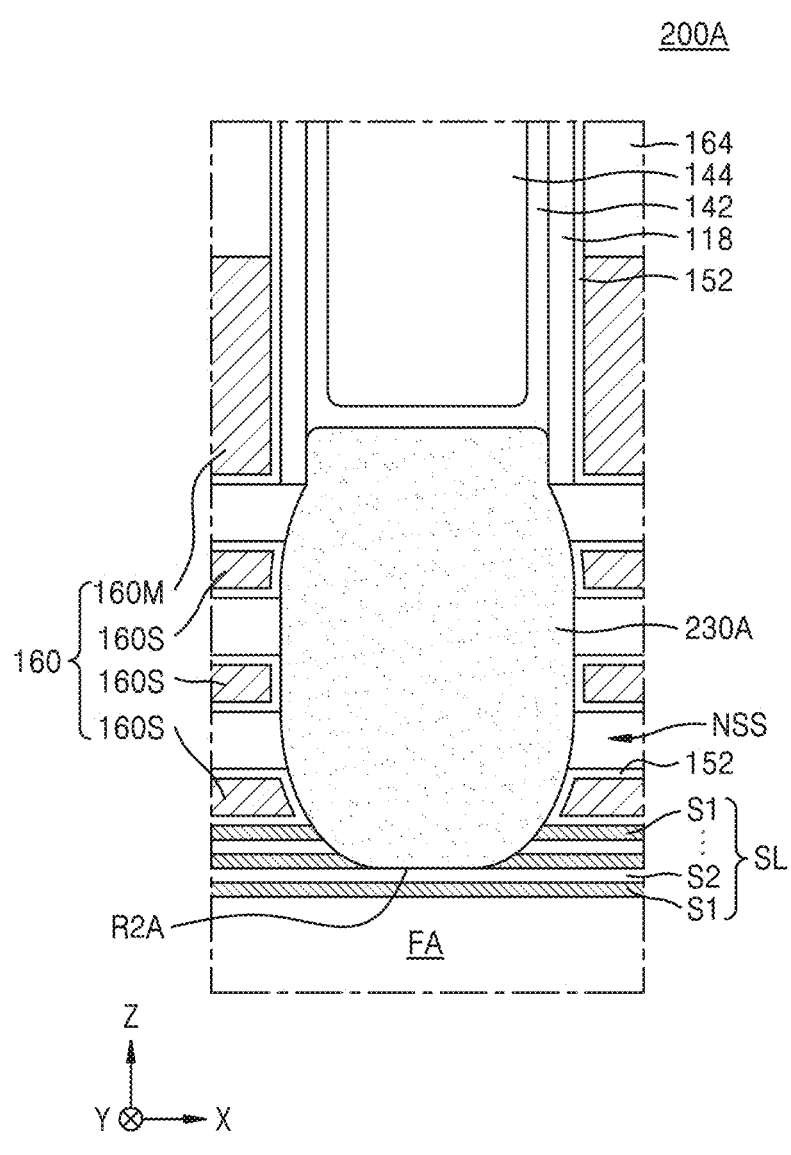

FIG. 7 is a cross-sectional view of an IC device 200A according to example embodiments. FIG. 7 illustrates an enlarged cross-sectional configuration of a region corresponding to the local region "EX1" of FIG. 2A.

Referring to FIG. 7, the IC device 200A may have substantially the same configuration as the IC device 100 described with reference to FIGS. 1 and 2A to 2D. However, the IC device 200A may include a source/drain region 230A instead of the source/drain region 130.

The source/drain region 230A may fill a recess R2A, which passes through a portion of the superlattice barrier SL. The lowermost surface of the source/drain region 230A may be in contact with a selected one of a plurality of second sub-layers S2 included in the superlattice barrier SL. FIG. 7 illustrates a configuration in which the lowermost surface of the source/drain region 230A is in contact with a lowermost one of the plurality of second sub-layers S2 included in the superlattice barrier SL, but the inventive concepts are not limited thereto. For example, the lowermost surface of the source/drain region 230A may be in contact with one or more of the plurality of second sub-layers S2 included in the superlattice barrier SL other than the lowermost one thereof. A detailed configuration of the source/drain region 230A may be substantially the same as that of the source/drain region 130 described with reference to FIGS. 2A to 2D.

Figure 8:
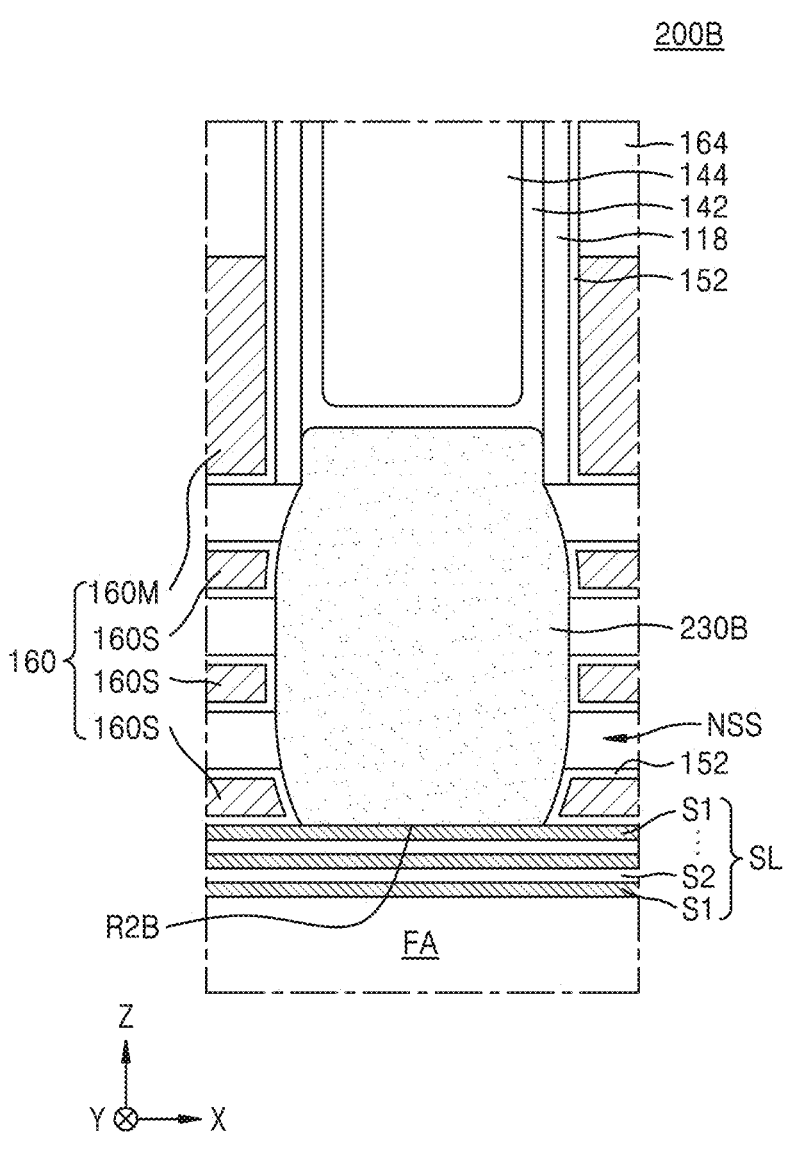

FIG. 8 is a cross-sectional view of an IC device 200B according to example embodiments. FIG. 8 illustrates an enlarged cross-sectional configuration of a region corresponding to the local region "EX1" of FIG. 2A.

Referring to FIG. 8, the IC device 200B may have substantially the same configuration as the IC device 100 described with reference to FIGS. 1 and 2A to 2D. However, the IC device 200B may include a source/drain region 230B instead of the source/drain region 130.

The source/drain region 230B may fill a recess R2B, which may not pass through a superlattice barrier SL. An inner wall of the bottom of the recess R2B may include a top surface of the superlattice barrier SL. A lowermost surface of the source/drain region 230B may be in contact with an uppermost one of the plurality of first sub-layers S1 included in the superlattice barrier SL. A detailed configuration of the source/drain region 230B may be substantially the same as that of the source/drain region 130 with reference to FIGS. 2A to 2D.

Figure 9:
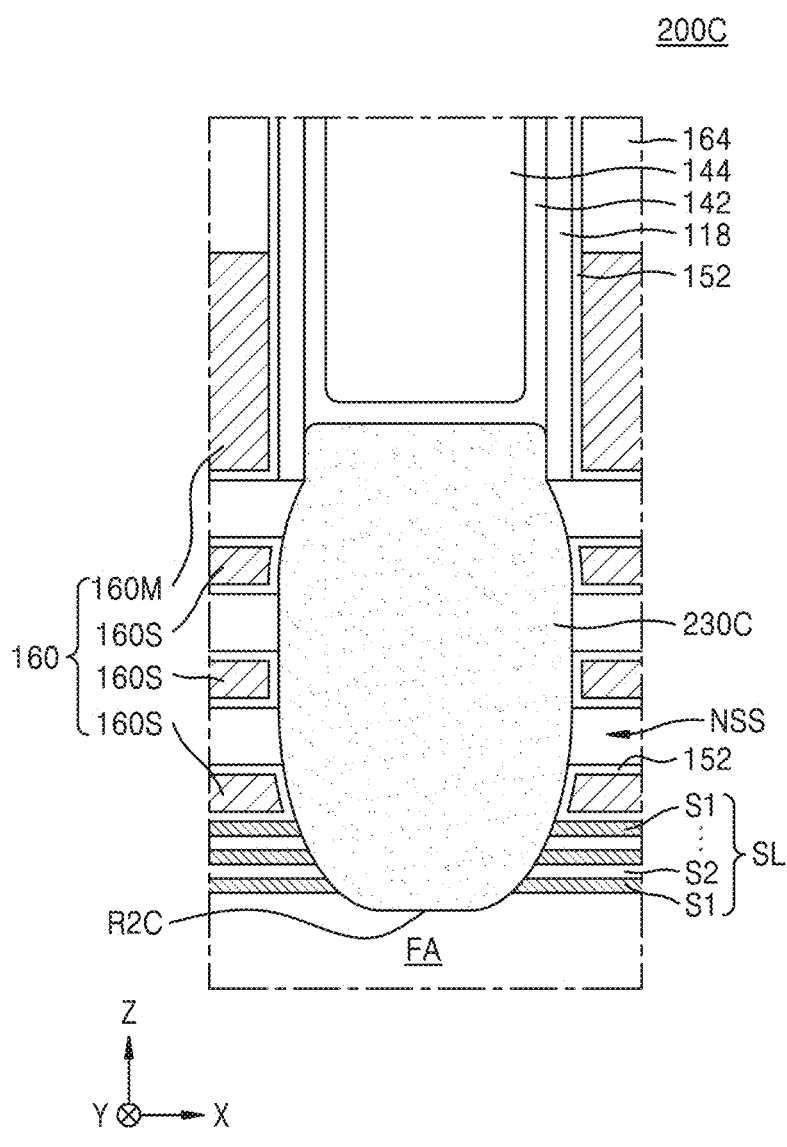

FIG. 9 is a cross-sectional view of an IC device 200C according to example embodiments. FIG. 9 illustrates an enlarged cross-sectional configuration of a region corresponding to the local region "EX1" of FIG. 2A.

Referring to FIG. 9, the IC device 200C may have substantially the same configuration as the IC device 100 described with reference to FIGS. 1 and 2A to 2D. However, the IC device 200C may include a source/drain region 230C instead of the source/drain region 130.

The source/drain region 230C may fill a recess R2C, which passes through the superlattice barrier SL from a top surface of the superlattice barrier SL to a bottom surface thereof in a vertical direction (Z direction). The source/drain region 230C may pass through the superlattice barrier SL from the top surface of the superlattice barrier SL to the bottom surface thereof in the vertical direction (Z direction) and extend into the fin-type active region FA. A lowermost surface of the source/drain region 230C may be in contact with the fin-type active region FA. The lowermost surface of the source/drain region 230C may be closer to the substrate (refer to 102 in FIGS. 2A to 2C) than a lowermost surface of the superlattice barrier SL. A detailed configuration of the source/drain region 230C may be substantially the same as that of the source/drain region 130 described with reference to FIGS. 2A to 2D.

In the IC device 200C, the superlattice barrier SL may include a discontinuous portion, which corresponds to the source/drain region 230C and is cut by the recess R2C, and intermittently extend on a fin-type active region FA in a first lateral direction (X direction).

Figure 10:
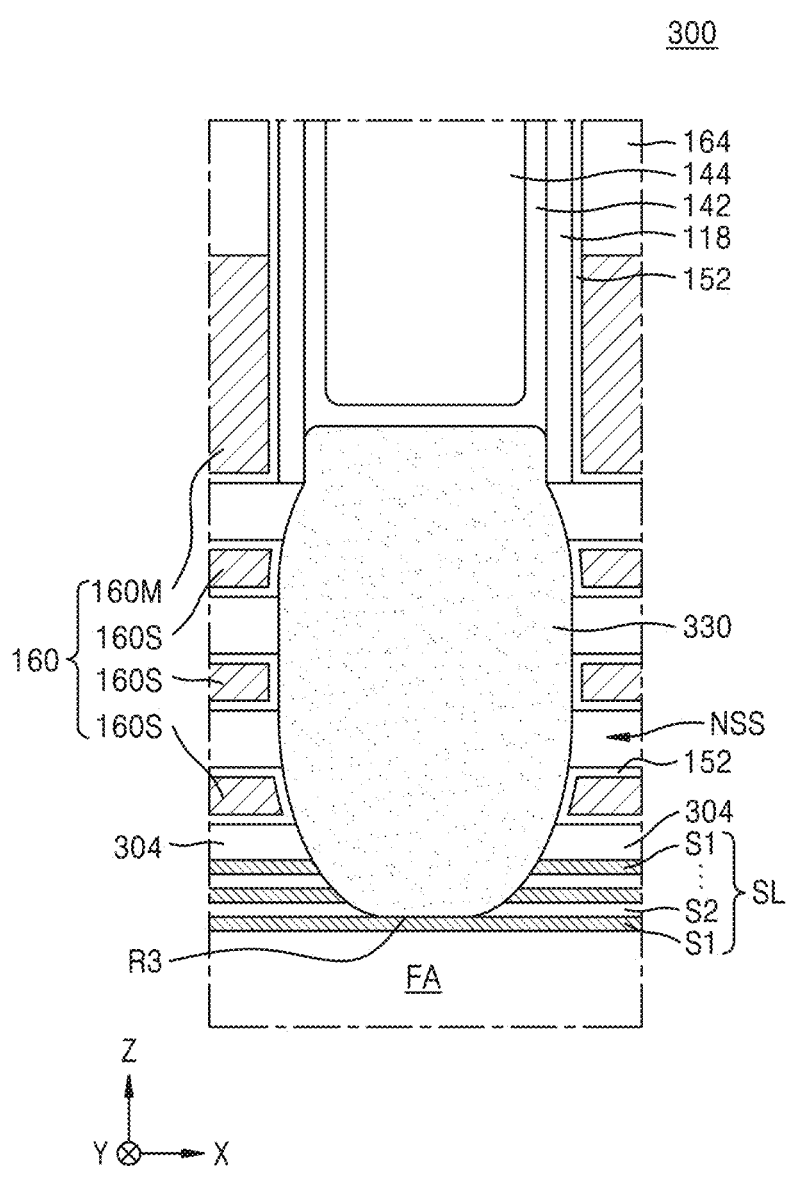

FIG. 10 is a cross-sectional view of an IC device 300 according to example embodiments. FIG. 10 illustrates an enlarged cross-sectional configuration of a region corresponding to the local region "EX1" of FIG. 2A.

Referring to FIG. 10, the IC device 300 may have substantially the same configuration as the IC device 100 described with reference to FIGS. 1 and 2A to 2D. However, the IC device 300 may further include an upper semiconductor layer 304 between a superlattice barrier SL and a gate line 160.

The upper semiconductor layer 304 may be between a first portion of a gate dielectric film 152, which is in contact with a bottom surface of a lowermost one of a plurality of sub-gate portions 160S of the gate line 160, and an uppermost surface of the superlattice barrier SL. The upper semiconductor layer 304 may have a bottom surface, which is in contact with the uppermost surface of the superlattice barrier SL, and a top surface, which is in contact with the first portion of the gate dielectric film 152.

The IC device 300 may include a source/drain region 330. The source/drain region 330 may fill a recess R3, which passes through the upper semiconductor layer 304 in a vertical direction (Z direction) and passes through a portion of the superlattice barrier SL in the vertical direction (Z direction). A detailed configuration of the source/drain region 330 may be substantially the same as that of the source/drain region 130 described with reference to FIGS. 2A to 2D.

The upper semiconductor layer 304 may include a portion in contact with the source/drain region 330. The source/drain region 330 may pass through the upper semiconductor layer 304 in the vertical direction (Z direction), and a lowermost surface of the source/drain region 330 may be in contact with a lowermost one of the plurality of first sub-layers S1 included in the superlattice barrier SL.

In example embodiments, the upper semiconductor layer 304 may include the same material as a constituent material of the first to third nanosheets N1, N2, and/or N3 included in the nanosheet stack NSS. In other example embodiments, the upper semiconductor layer 304 may include a different material from the constituent material of the first to third nanosheets N1, N2, and/or N3 included in the nanosheet stack NSS. For example, the upper semiconductor layer 304 may include an undoped silicon layer, a silicon layer doped with a p-type dopant, or a silicon layer doped with an n-type dopant, without being limited thereto.

In example embodiments, the upper semiconductor layer 304 may provide a channel region of a bottom transistor including a sub-gate portion 160S, which is closest to a fin-type active region FA, from among the plurality of sub-gate portions 160S.

Figure 11:
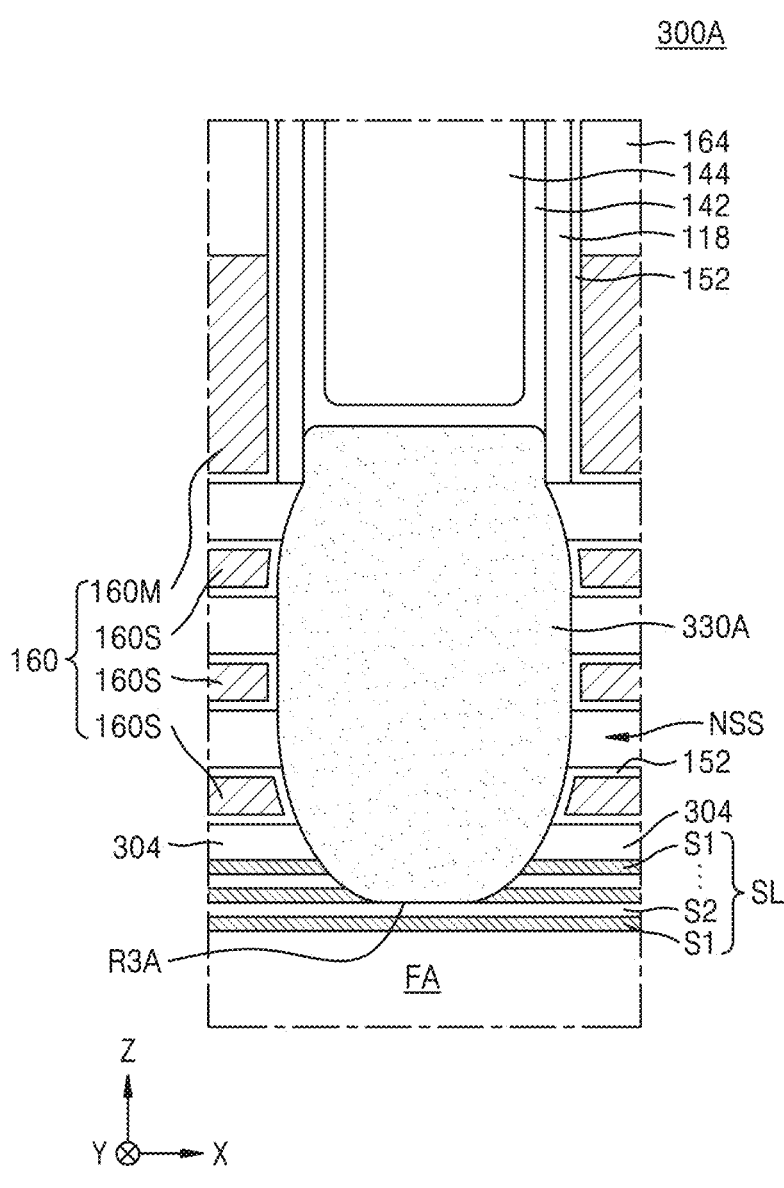

FIG. 11 is a cross-sectional view of an IC device 300A according to embodiments. FIG. 11 illustrates an enlarged cross-sectional configuration of a region corresponding to the local region "EX1" of FIG. 2A.

Referring to FIG. 11, the IC device 300A may have substantially the same configuration as the IC device 300 described with reference to FIG. 10. However, the IC device 300A may include a source/drain region 330A instead of the source/drain region 330.

The source/drain region 330A may fill a recess R3A, which passes through an upper semiconductor layer 304 from a top surface of the upper semiconductor layer 304 to a bottom surface thereof in a vertical direction (Z direction) and passes through a portion of a superlattice barrier SL. The source/drain region 330A may pass through the upper semiconductor layer 304 in the vertical direction (Z direction), and a lowermost surface of the source/drain region 330A may be in contact with a selected one of a plurality of second sub-layers S2 included in the superlattice barrier SL. FIG. 11 illustrates an example configuration in which the lowermost surface of the source/drain region 330A is in contact with a lowermost one of the plurality of second sub-layers S2 included in the superlattice barrier SL, but the inventive concepts are not limited thereto. For example, the lowermost surface of the source/drain region 330A may be in contact with one of the plurality of second sub-layers S2 included in the superlattice barrier SL other than the lowermost one thereof. A detailed configuration of the source/drain region 330A may be substantially the same as that of the source/drain region 130 described with reference to FIGS. 2A to 2D.

In the IC device 300A, the upper semiconductor layer 304 may include a discontinuous portion, which corresponds to the source/drain region 330A and is cut by the recess R3A, and extend on a fin-type active region FA in a first lateral direction (X direction).

Figure 12:
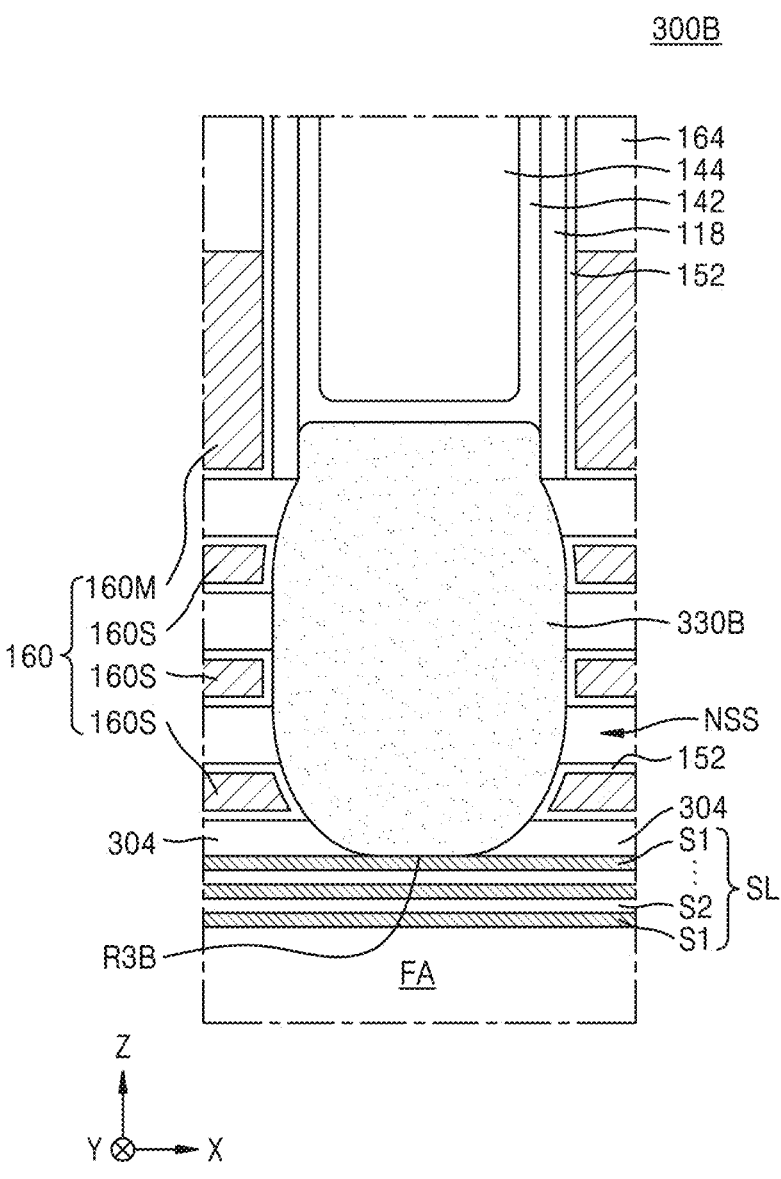

FIG. 12 is a cross-sectional view of an IC device 300B according to example embodiments. FIG. 12 illustrates an enlarged cross-sectional configuration of a region corresponding to the local region "EX1" of FIG. 2A.

Referring to FIG. 12, the IC device 300B may have substantially the same configuration as the IC device 300 described with reference to FIG. 10. However, the IC device 300B may include a source/drain region 330B instead of the source/drain region 330.

The source/drain region 330B may fill a recess R3B, which passes through the upper semiconductor layer 304 from a top surface of the upper semiconductor layer 304 to a bottom surface thereof in a vertical direction (Z direction). The source/drain region 330B may pass through the upper semiconductor layer 304, and a lowermost surface of the source/drain region 330B may be in contact with an uppermost one of the plurality of first sub-layers S1 included in the superlattice barrier SL. A detailed configuration of the source/drain region 330B may be substantially the same as that of the source/drain region 130, which has been described with reference to FIGS. 2A to 2D.

In the IC device 300B, the upper semiconductor layer 304 may include a discontinuous portion, which corresponds to the source/drain region 330B and is cut by the recess R3B, and intermittently extend on a fin-type active region FA in a first lateral direction (X direction).

Figure 13:
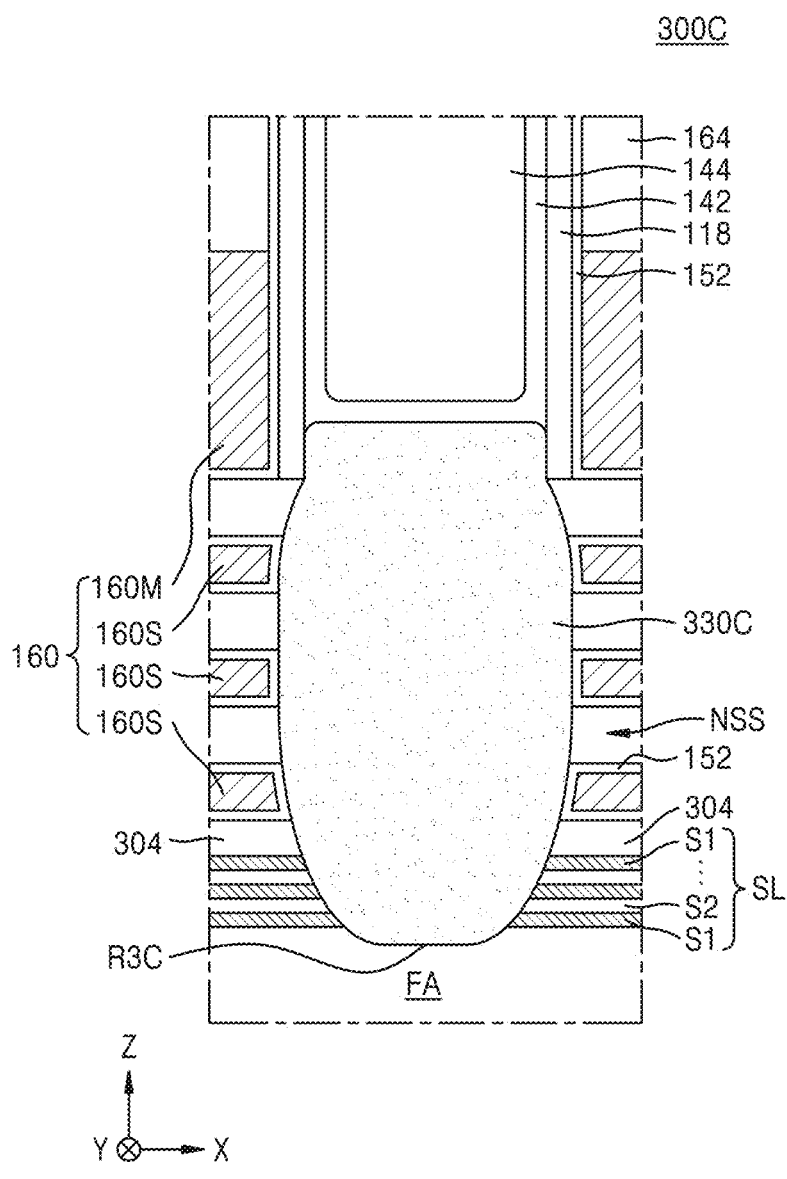

FIG. 13 is a cross-sectional view of an IC device 300C according to example embodiments. FIG. 13 illustrates an enlarged cross-sectional configuration of a region corresponding to the local region "EX1" of FIG. 2A.

Referring to FIG. 13, the IC device 300C may have substantially the same configuration as the IC device 300 described with reference to FIG. 10. However, the IC device 300C may include a source/drain region 330C instead of the source/drain region 330.

The source/drain region 330C may fill a recess R3C, which passes through the upper semiconductor layer 304 from a top surface of the upper semiconductor layer 304 to a bottom surface thereof in a vertical direction (Z direction) and passes through the superlattice barrier SL from a top surface of the semiconductor barrier SL to a bottom surface thereof in the vertical direction (Z direction). The source/drain region 330C may pass through the upper semiconductor layer 304 and the superlattice barrier SL in the vertical direction (Z direction) and extend into a fin-type active region FA. A lowermost surface of the source/drain region 330C may be in contact with the fin-type active region FA. The lowermost surface of the source/drain region 330C may be closer to a substrate (refer to 102 in FIGS. 2A to 2C) than a lowermost surface of the superlattice barrier SL. A detailed configuration of the source/drain region 330C may be substantially the same as that of the source/drain region 130 described with reference to FIGS. 2A to 2D.

In the IC device 300C, each or one or more of the upper semiconductor layer 304 and the superlattice barrier SL may include a discontinuous portion, which corresponds to the source/drain region 330C and is cut by the recess R3C. The upper semiconductor layer 304 and the superlattice barrier SL may intermittently extend on the fin-type active region FA in a first lateral direction (X direction).

Figure 14:
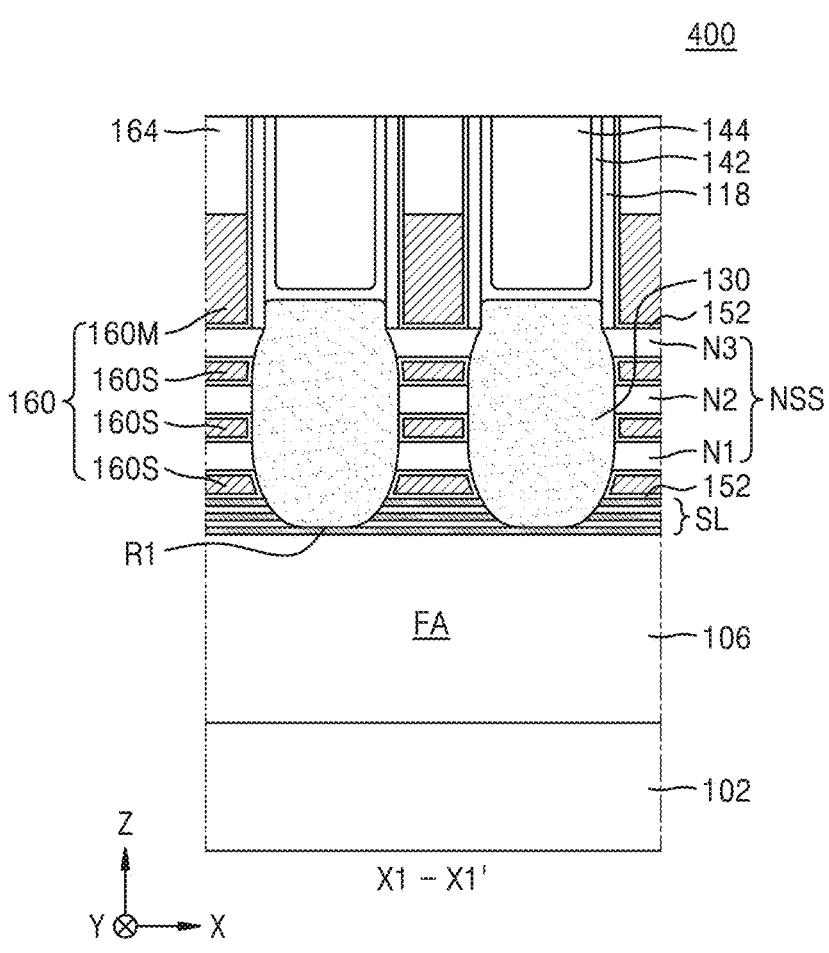

FIG. 14 is a cross-sectional view of an IC device 400 according to example embodiments. FIG. 14 illustrates a partial configuration of a portion corresponding to a cross-section taken along line X1-X1' of FIG. 1.

Referring to FIG. 14, the IC device 400 may have substantially the same configuration as the IC device 100 described with reference to FIGS. 1 and 2A to 2D. However, the IC device 400 may include a well 106, which surrounds a plurality of source/drain regions 130 and/or a superlattice barrier SL in a substrate 102. The well 106 may include an impurity region, which is doped at a concentration different from a dopant concentration of the substrate 102. The well 106 may include an N-type dopant or a P-type dopant depending on a conductivity type of a channel of a transistor. The well 106 may include an impurity region of a conductivity type opposite to a conductivity type of the source/drain region 130. For example, when the plurality of source/drain regions 130 include an N-type dopant, the well 106 may include a P-type dopant; whereas the plurality of source/ drain regions 130 include the P-type dopant, the well 106 may include the N-type dopant.

Figure 15:
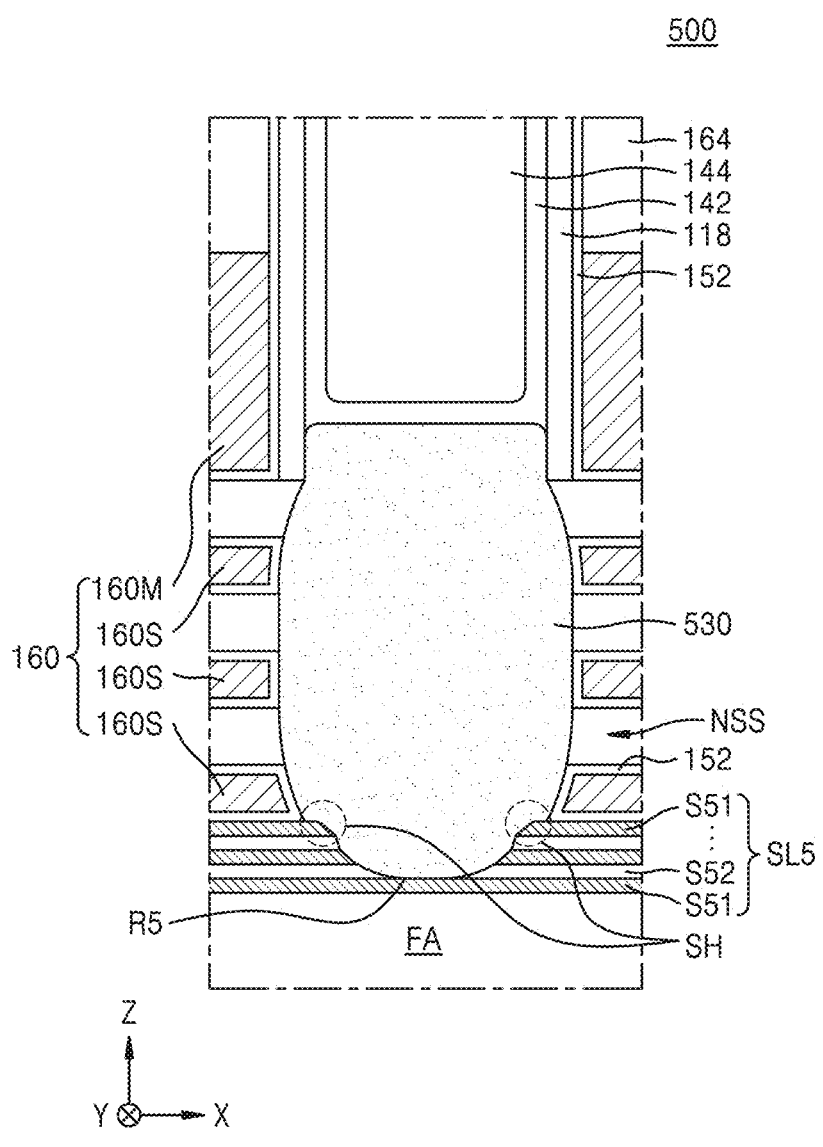

FIG. 15 is a cross-sectional view of an IC device 500 according to example embodiments. FIG. 15 illustrates an enlarged cross-sectional configuration of a region corresponding to the local region "EX1" of FIG. 2A.

Referring to FIG. 15, the IC device 500 may have substantially the same configuration as the IC device 100 described with reference to FIGS. 1 and 2A to 2D. However, the IC device 500 may include a source/drain region 530 instead of the source/drain region 130 and include a superlattice barrier SL5 instead of the superlattice barrier SL.

The source/drain region 530 may fill a recess R5, which passes through a portion of the superlattice barrier SL5 in a vertical direction (Z direction). The source/drain region 530 may have a lower surface facing the superlattice barrier SL5 and an upper surface facing the nanosheet stack NSS, and a roughness of the lower surface of the source/drain region 530 may be higher than a roughness of the upper surface thereof.

The superlattice barrier SL5 may have a structure in which a plurality of first sub-layers S51 including a semiconductor layer doped with oxygen atoms and a plurality of second sub-layers S52 including an undoped semiconductor layer are alternately stacked one by one. A portion of the superlattice barrier SL5, which is in contact with the source/drain region 530, may include a shoulder portion SH, which is a portion of an uppermost one of the plurality of first sub-layers S51 included in the superlattice barrier SL5. A surface of the superlattice barrier SL5, which is in contact with the source/drain region 530, may have superlattice bends at interfaces between the first sub-layer S51 and the second sub-layer S52, which are adjacent to each other. The source/drain region 530 may have source/drain bends, which face the superlattice bends of the superlattice barrier SL5 and have shapes corresponding to the superlattice bends.

In the superlattice barrier SL5, a slope of an end surface of each or one or more of the plurality of first sub-layers S51, which is in contact with the source/drain region 530, may be less than a slope of an end surface of each or one or more of the plurality of second sub-layers S52, which is in contact with the source/drain region 530. That is, in a cross-section taken along an X-Z plane of FIG. 15, an angle between a first straight line in a first lateral direction (X direction) and the end surface of each or one or more of the plurality of first sub-layers S51, which is in contact with the source/drain region 530, may be less than an angle between the first straight line and the end surface of each or one or more of the plurality of second sub-layers S52, which is in contact with the source/drain region 530.

Figure 16:
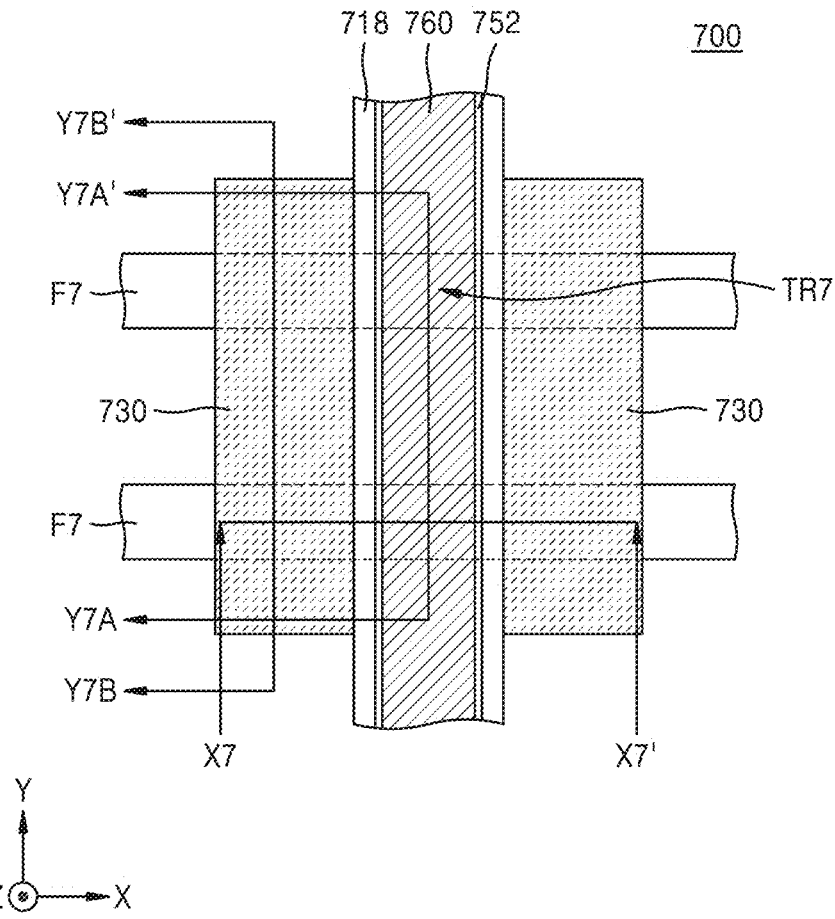
FIG. 16 is a plan layout diagram of an IC device according to example embodiments.
Figure 17A:
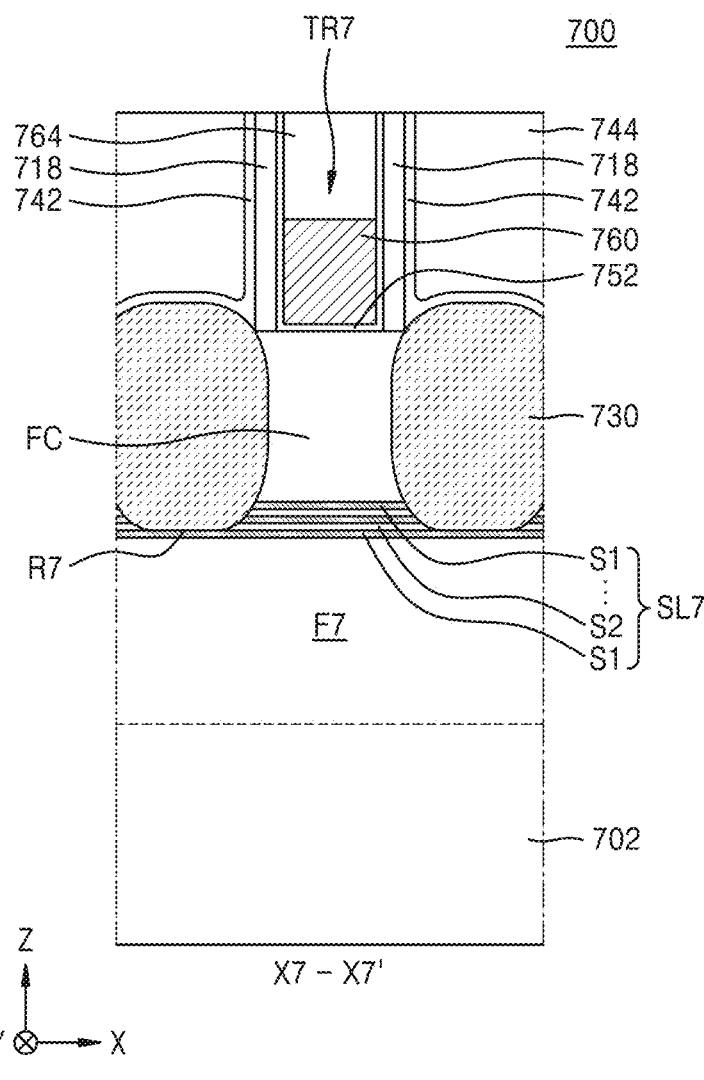
FIG. 17A is a cross-sectional view of some components corresponding to a cross-section taken along line X7-X7' of FIG. 16.
Figure 17B:
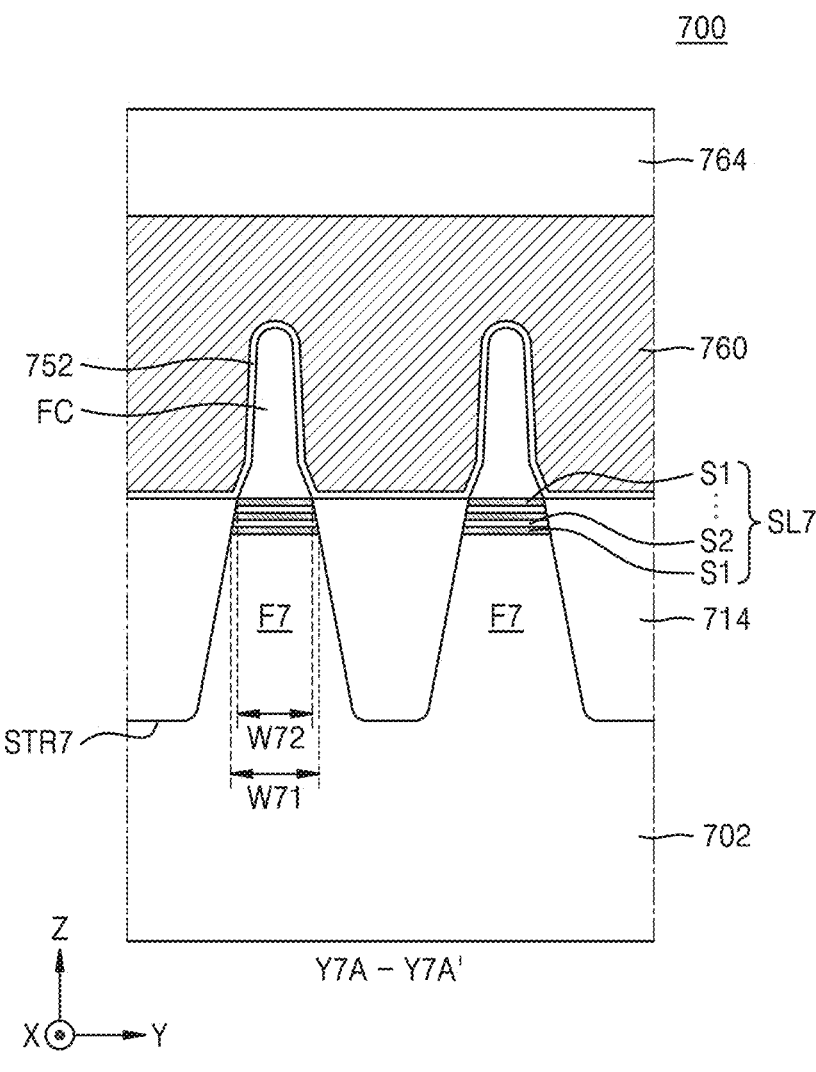
FIG. 17B is a cross-sectional view of some components corresponding to a cross-section taken along line Y7A-Y7A' of FIG. 16.
Figure 17C:
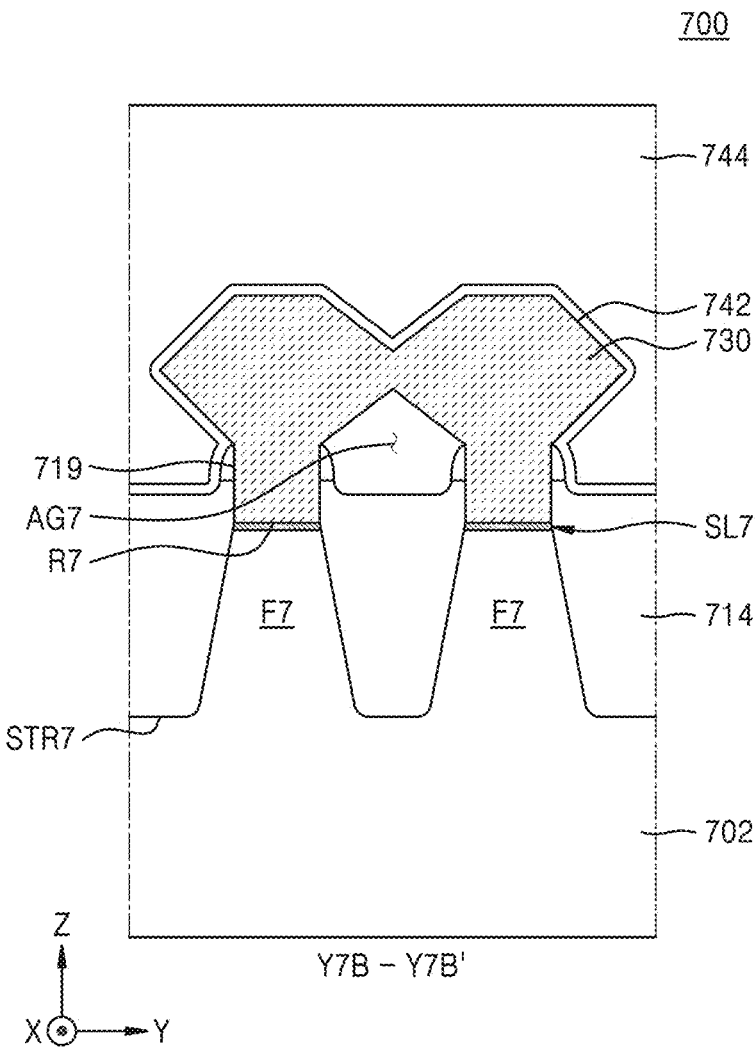
FIG. 17C is a cross-sectional view of some components corresponding to a cross-section taken along line Y7B-Y7B' of FIG. 16.

FIG. 16 is a plan layout diagram of an IC device 700 according to example embodiments. FIG. 17A is a cross-sectional view of some components corresponding to a cross-section taken along line X7-X7' of FIG. 16. FIG. 17B is a cross-sectional view of some components corresponding to a cross-section taken along line Y7A-Y7A' of FIG. 16. FIG. 17C is a cross-sectional view of some components corresponding to a cross-section taken along line Y7B-Y7B' of FIG. 16.

Referring to FIGS. 16 and 17A to 17C, the IC device 700 may include a plurality of fin-type active regions F7, which protrude from a substrate 702 in a vertical direction (Z direction). The plurality of fin-type active regions F7 may extend parallel to each other in a first lateral direction (X direction). Each or one or more of the plurality of fin-type active regions F7 may be defined by a device isolation trench STR7 formed in the substrate 702. The device isolation trench STR7 may be filled with a device isolation film 714. Sidewalls of each or one or more of the plurality of fin-type active regions F7 may be covered by the device isolation film 714.

Detailed configurations of the substrate 702, the plurality of fin-type active regions F7, and the device isolation film 714 may be substantially the same as those of the substrate 102, the plurality of fin-type active regions FA, and the device isolation film 114, which have been described with reference to FIGS. 1 and 2A to 2D.

A fin channel region FC may be on the plurality of fin-type active regions F7 and protrude from the device isolation film 714, and the superlattice barrier SL7 may be between the substrate 102 and the fin channel region FC. The superlattice barrier SL7 may be between the fin-type active region F7 and the fin channel region FC. A bottom surface of the superlattice barrier SL7 may be in contact with a top surface of the fin-type active region F7, and a top surface of the superlattice barrier SL7 may be in contact with a bottom surface of the fin channel region FC.

As shown in FIG. 17B, in a second lateral direction (Y direction), at least some of the plurality of first sub-layers S1 and/or the plurality of second sub-layers S2, which are included in the superlattice barrier SL7, may have different widths. In example embodiments, the plurality of first sub-layers 51 and/or the plurality of second sub-layers S2, which are included in the superlattice barrier SL7, may have gradually increased widths in the second lateral direction (Y direction) toward the fin-type active region F7. For example, in the superlattice barrier SL, a first width W71 of the first sub-layer S1, which is closest to the fin-type active region F7, in the second lateral direction (Y direction) may be greater than a second width W72 of the first sub-layer S1, which is farthest from the fin-type active region F7, in the second lateral direction (Y direction). A detailed configuration of the superlattice barrier SL7 may be substantially the same as that of the superlattice barrier SL described with reference to FIGS. 2A to 2D.

As shown in FIGS. 17A and 17B, on the plurality of fin-type active regions F7 and/or the device isolation film 714, a gate line 760 may surround the fin channel region FC and extend long in the second lateral direction (Y direction). Although FIG. 16 exemplarily illustrates two fin-type active regions F7 and one gate line 760 on the two fin-type active region F7, the number of fin-type active regions F7 and/or the number of gate lines 760 are not limited thereto and may be variously selected.

As shown in FIG. 17B, the device isolation film 714 may be between the substrate 702 and the gate line 760. In the second lateral direction (Y direction), both sidewalls of the fin-type active region F7 and/or both sidewalls of the superlattice barrier SL7 may be covered by the device isolation film 714.

As shown in FIG. 17A, a plurality of recesses R7 may be formed on both sides of the fin channel region FC and pass through portions of the superlattice barrier SL7 in the vertical direction (Z direction). The plurality of recesses R7 may be filled with a plurality of source/drain regions 730.

Constituent materials of the fin channel region FC, the gate line 760, and/or the plurality of source/drain regions 730 may be respectively substantially the same as those of the first to third nanosheets N1, N2, and/or N3, the gate line 160, and/or the plurality of source/drain regions 130, which have been described with reference to FIGS. 2A to 2D.

As shown in FIG. 17A, each or one or more of the plurality of source/drain regions 730 may include a portion, which passes through a portion of the superlattice barrier SL7 in the vertical direction (Z direction) and is in contact with the superlattice barrier SL7. The superlattice barrier SL7 may surround a lowermost surface of each or one or more of the plurality of source/drain regions 730, and the lowermost surface of each or one or more of the plurality of source/drain regions 730 may be in contact with a selected one of the plurality of first sub-layers S1 and/or the plurality of second sub-layers S2, which are included in the superlattice barrier SL7. For example, the lowermost surface of the source/drain region 730 may be in contact with a selected one of the plurality of first sub-layers S1 included in the superlattice barrier SL7. However, the inventive concepts are not limited thereto.

In other example embodiments, similar to the source/drain region 230A of the IC device 200A described with reference to FIG. 7, the lowermost surface of the source/drain region 730 may be in contact with a selected one of the plurality of second sub-layers S2 included in the superlattice barrier SL. In still other example embodiments, similar to the source/drain region 230B of the IC device 200B described with reference to FIG. 8, the lowermost surface of the source/drain region 730 may be in contact with an uppermost one of the plurality of first sub-layers S1 included in the superlattice barrier SL. In yet other example embodiments, similar to the source/drain region 230C of the IC device 200C described with reference to FIG. 9, the source/drain region 730 may pass through the superlattice barrier SL7 from a top surface of the superlattice barrier SL7 to a bottom surface thereof in a vertical direction (Z direction), and the lowermost surface of the source/drain region 730 may be in contact with the fin-type active region F7. In this case, the lowermost surface of the source/drain region 730 may be closer to the substrate 702 than a lowermost surface of the superlattice barrier SL7.

A plurality of transistors TR7 may be formed at intersections between the plurality of fin-type active regions F7 and the gate line 760. Each or one or more of the plurality of transistors TR7 may be an NMOS transistor or a PMOS transistor.

A gate dielectric film 752 may be between the fin channel region FC and the gate line 760. The gate dielectric film 752 may include portions covering a surface of the fin channel region FC, portions covering sidewalls of the gate line 760, and/or portions between a top surface of the device isolation film 714 and a bottom surface of the gate line 760. A constituent material of the gate dielectric film 752 may be the same as that of the gate dielectric film 152, which has been described with reference to FIGS. 2A to 2D.

As shown in FIGS. 17A and 17B, the gate line 760 may be covered by a capping insulating pattern 764. As shown in FIGS. 16 and 17A, in the IC device 700, sidewalls of each or one or more of the gate line 760 and the capping insulating pattern 764 may be covered by insulating spacers 718. As shown in FIG. 17C, the IC device 700 may include a plurality of recess-side insulating spacers 719, which are on a top surface of the device isolation film 714 and cover sidewalls of the source/drain region 730. In example embodiments, each or one or more of the plurality of recess-side insulating spacers 719 may be integrally connected to the insulating spacer 718 adjacent thereto. An air gap AG7 may be in a space defined by the recess-side insulating spacer 719 and the source/drain region 730 and the device isolation film 714, which are adjacent thereto. Constituent materials of the capping insulating pattern 764, the insulating spacer 718, and/or the recess-side insulating spacer 719 may be respectively substantially the same as those of the capping insulating pattern 164, the outer insulating spacer 118, and/or the recess-side insulating spacer 119, which have been described with reference to FIGS. 2A to 2D.

As shown in FIGS. 17A and 17C, a partial surface of each or one or more of the plurality of source/drain regions 730 may be covered by an insulating liner 742. The insulating liner 742 may be covered by an inter-gate dielectric film 744. Constituent materials of the insulating liner 742 and/or the inter-gate dielectric film 744 may be respectively substantially the same materials as those of the insulating liner 142 and/or the inter-gate dielectric film 144, which have been described with reference to FIGS. 2A and 2D.

Although not shown in FIGS. 17A to 17C, in the IC device 700, source/drain contacts having similar structures to the source/drain contacts 184 described with reference to FIG. 4 may be on the plurality of source/drain regions 730.

In the IC device 700, a size of each or one or more of the plurality of source/drain regions 730 in the vertical direction (Z direction) may be uniformly controlled by the plurality of first sub-layers S1 included in the superlattice barrier SL7. Accordingly, the plurality of source/drain regions 730 included in the transistor TR7 may have a uniformly controlled shape. Furthermore, during the process of forming the plurality of source/drain regions 730, while a semiconductor material is being epitaxially grown from the fin channel region FC exposed at the plurality of recesses R7, a semiconductor material may be epitaxially grown from surfaces of the plurality of first sub-layers S1 and/or the plurality of second sub-layers S2, which are respectively exposed at lower sides of the plurality of recesses R7. Thus, the plurality of source/drain regions 730, having reduced voids and/or defects or which are free of voids and/or defects, may be obtained. Accordingly, contact resistances of the plurality of source/drain regions 730 may be reduced, distributions of electrical characteristics of the plurality of source/drain regions 730 may be improved, and electrical characteristics of the transistor TR7 including the plurality of source/drain regions 730 may be improved.

FIGS. 18A to 18J are cross-sectional views of a process sequence of a method of manufacturing an IC device, according to example embodiments. A method of manufacturing the IC device 100 shown in FIGS. 1 and 2A to 2D, according to an example embodiment, will be described with reference to FIGS. 18A to 18J. In FIGS. 18A to 18J, the same reference numerals are used to denote the same elements as in FIGS. 1 and 2A to 2D, and detailed descriptions thereof are omitted.

Figure 18A:
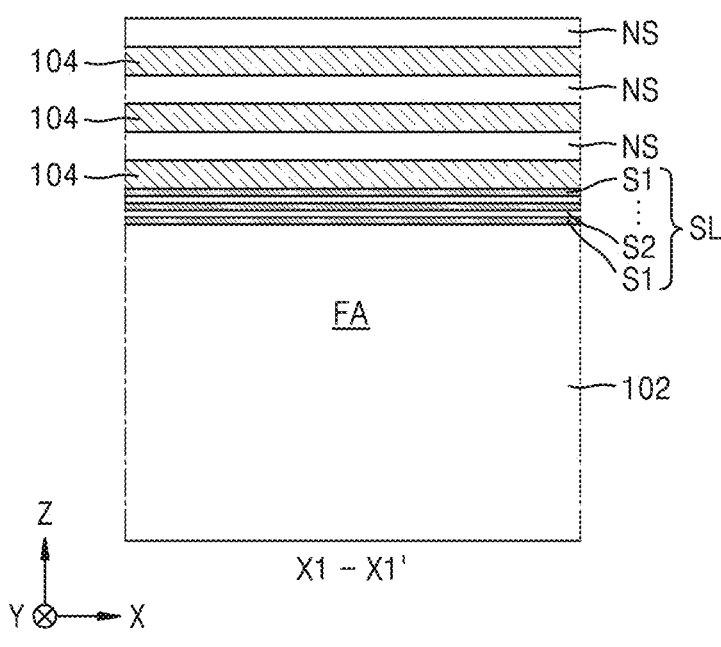
FIGS. 18A to 18J are cross-sectional views of a process sequence of a method of manufacturing an IC device, according to example embodiments.

Referring to FIG. 18A, a superlattice barrier SL may be formed by alternately stacking a plurality of first sub-layers S1 including a semiconductor layer doped with oxygen atoms and a plurality of second sub-layers S2 including an undoped semiconductor layer one by one on a substrate 102. Thereafter, a plurality of sacrificial semiconductor layers 104 and a plurality of nanosheet semiconductor layers NS may be alternately stacked one by one on the superlattice barrier SL. Portions of the plurality of sacrificial semiconductor layers 104, the plurality of nanosheet semiconductor layers NS, the superlattice barrier SL, and/or the substrate 102 may be etched to define a plurality of fin-type active regions FA in the substrate 102. After the plurality of fin-type active regions FA are defined, the superlattice barrier SL and/or the stack structure of the plurality of sacrificial semiconductor layers 104 and/or the plurality of nanosheet semiconductor layers NS may remain on each or one or more of the plurality of fin-type active regions FA. Thereafter, a device isolation film (refer to 114 in FIGS. 2B and 2C) may be formed to cover sidewalls of the plurality of fin-type active regions FA and/or the superlattice barrier SL remaining on the plurality of fin-type active regions FA.

The plurality of sacrificial semiconductor layers 104 and/or the plurality of nanosheet semiconductor layers NS may include semiconductor materials having different etch selectivities. In example embodiments, the plurality of nanosheet semiconductor layers NS may include a silicon (Si) layer, and/or the plurality of sacrificial semiconductor layers 104 may include a silicon germanium (SiGe) layer. In example embodiments, the plurality of sacrificial semiconductor layers 104 may have a constant Ge concentration. The SiGe layer included in the plurality of sacrificial semiconductor layers 104 may have a constant Ge concentration, which is selected in a range of about 5 at % to about 60 at %, for example, about 10 at % to about 40 at %. The Ge concentration of the SiGe layer included in the plurality of sacrificial semiconductor layers 104 may be variously selected as needed or desired.

Figure 18B:
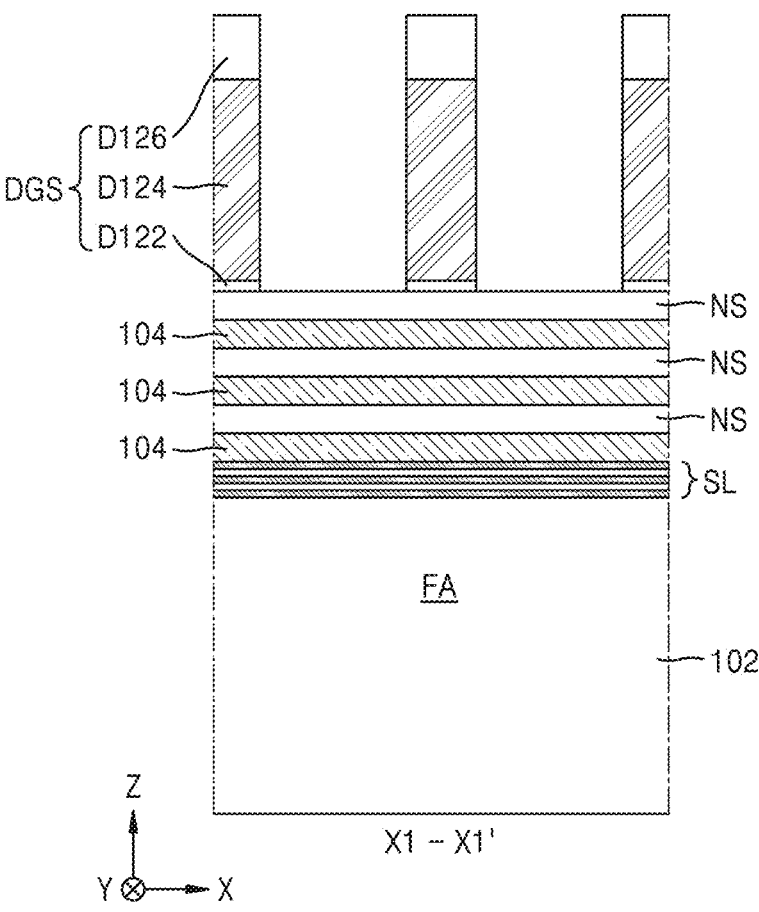

Referring to FIG. 18B, a plurality of dummy gate structures DGS may be formed on the stack structure of the plurality of sacrificial semiconductor layers 104 and/or the plurality of nanosheet semiconductor layers NS.

Each or one or more of the plurality of dummy gate structures DGS may be formed to extend long in a second lateral direction (Y direction). Each or one or more of the plurality of dummy gate structures DGS may have a structure in which an oxide film D122, a dummy gate layer D124, and/or a capping layer D126 are sequentially stacked. In example embodiments, the dummy gate layer D124 may include polysilicon, and/or the capping layer D126 may include a silicon nitride film.

Figure 18C:
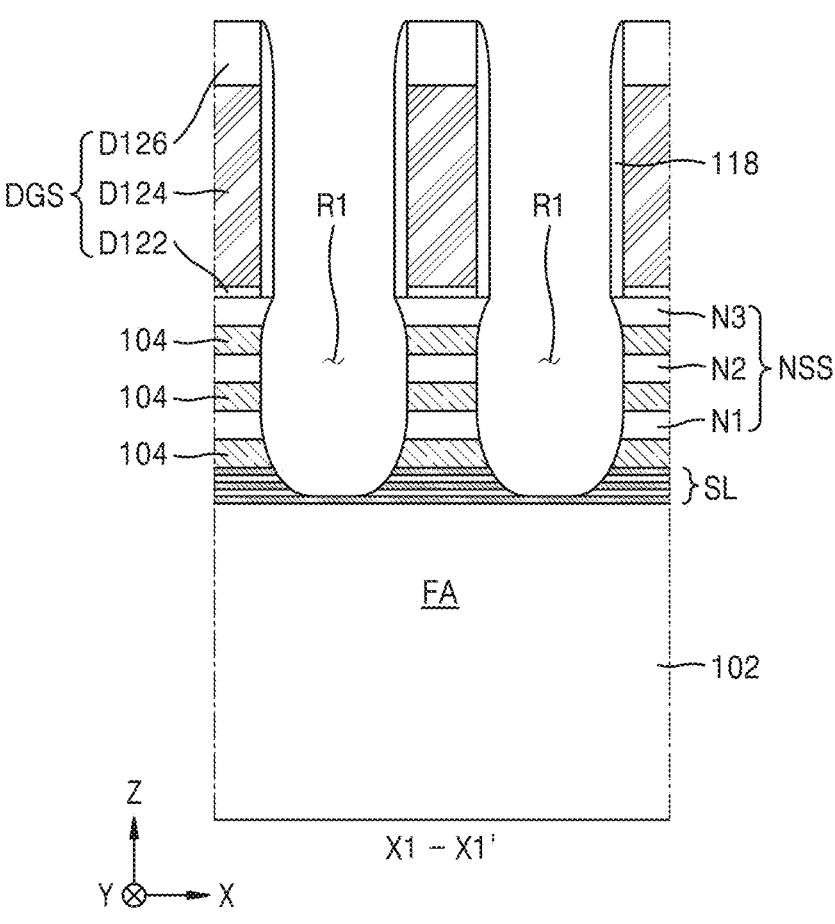

Referring to FIG. 18C, a plurality of outer insulating spacers 118 may be formed to cover both sidewalls of each or one or more of the plurality of dummy gate structures DGS. Thereafter, respective portions of the plurality of sacrificial semiconductor layers 104 and/or the plurality of nanosheet semiconductor layers NS may be removed using the plurality of dummy gate structures DGS and/or the plurality of outer insulating spacers 118 as etch masks, and thus, the plurality of nanosheet semiconductor layers NS may be divided into a plurality of nanosheet stacks NSS. Continuously, a portion of the superlattice barrier SL may be etched to form a recess R1. During the etching process for forming the recess R1, the superlattice barrier SL may serve as an etch stop film. By controlling an etching time and/or etching conditions during the etching process for forming the recess R1, a film exposed at the bottom of the recess R1 may be selected from the plurality of first sub-layers S1 and/or the plurality of second sub-layers S2, which are included in the superlattice barrier SL.

A plurality of recesses R1 may be etched using a dry etching process, a wet dry etching process and/or a combination thereof. In example embodiments, to form the plurality of recesses R1, hydrogen chloride (HCl) gas, chlorine ($Cl_2$) gas, and/or sulfur trifluoride ($SF_3$) gas and/or gases having etching characteristics similar thereto may be used, without being limited thereto.

During the etching process for forming the recess R1, a height of a partial region of the device isolation film 114 may be reduced as shown in FIG. 2C, and recess-side insulating spacers 119 may remain on both sides of the recess R1 in the second lateral direction (Y direction). The recess-side insulating spacer 119 may be integrally connected to the outer insulating spacer 118 adjacent thereto.

Although FIG. 18C illustrates a case in which the first sub-layer S1 included in the superlattice barrier SL is exposed at the bottom of the recess R1, the inventive concepts are not limited thereto. In example embodiments, similar to the recess R2A of the IC device 200A shown in FIG. 7, the second sub-layer S2 included in the superlattice barrier SL may be exposed at the bottom of the recess R1. In other example embodiments, similar to the recess R2B of the IC device 200B shown in FIG. 8, an uppermost one of the plurality of first sub-layers S1 included in the superlattice barrier SL may be exposed at the bottom of the recess R1. In yet other example embodiments, similar to the recess R2B of the IC device 200C shown in FIG. 9, the recess R1 may pass through the superlattice barrier SL from a top surface of the superlattice barrier SL to a bottom surface thereof in the vertical direction (Z direction), and thus, the fin-type active region FA may be exposed at the bottom of the recess R1.

Figure 18D:
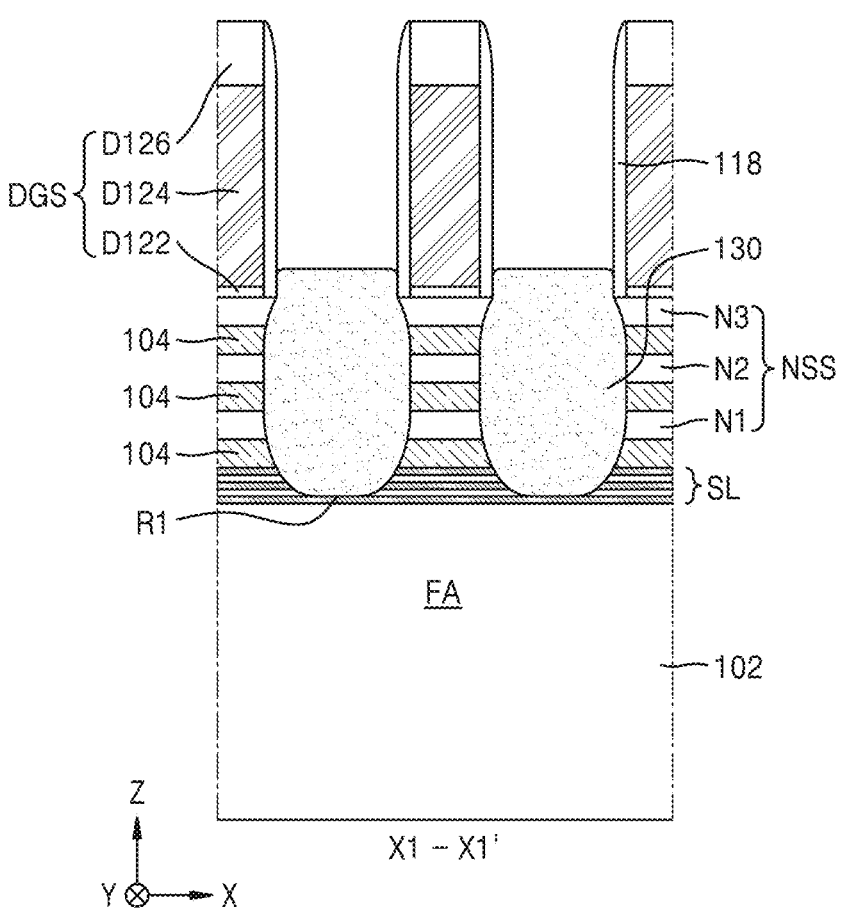

Referring to FIG. 18D, in the resultant structure of FIG. 18C, a plurality of source/drain regions 130 may be formed on the superlattice barrier SL on both sides of each or one or more of the plurality of nanosheet stacks NSS.

The plurality of source/drain regions 130 may be formed using a selective epitaxial growth (SEG) process. In an initial stage of the SEG process, a semiconductor film may be locally epitaxially grown from surfaces of the plurality of nanosheet stacks NSS, which are exposed inside the plurality of recesses R1, and/or surfaces of the plurality of first sub-layers 51 and/or the plurality of second sub-layers S2, which are included in the superlattice barrier SL exposed inside the plurality of recesses R1. Thereafter, the semiconductor film may be gradually grown during the SEG process, and thus, the source/drain regions 130 of high quality, which are free of voids or defects, may be obtained as shown in FIG. 18D.

In example embodiments, when the plurality of source/drain regions 130 include a SiGe layer, a Si source and/or a Ge source may be used to form the plurality of source/drain regions 130 using the SEG process. Silane ($SiH_4$), disilane ($Si_2H_6$), trisilane ($Si_3H_8$), and/or dichlorosilane ($SiH_2Cl_2$) may be used as the silicon source, without being limited thereto. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source, without being limited thereto. When the plurality of source/drain regions 130 include a SiGe layer doped with boron (B), a B source may be further used in addition to the Si source and the Ge source. Diborane ($B_2H_6$), triborane, tetraborane, and/or pentaborane may be used as the B source, without being limited thereto. In example embodiments, during an epitaxial growth process for forming the plurality of source/drain regions 130, a B dopant ion implantation process using the B source may be performed in-situ.

Figure 18E:
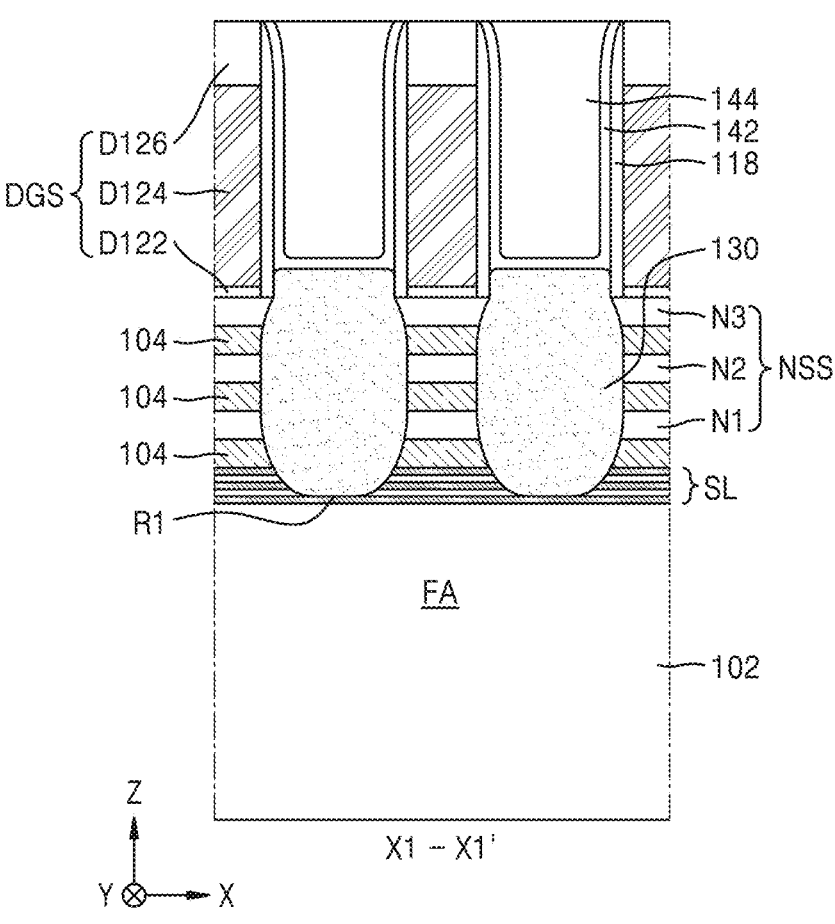

Referring to FIG. 18E, an insulating liner 142 may be formed to cover the resultant structure of FIG. 18D, which includes the plurality of source/drain regions 130, and an inter-gate dielectric film 144 may be formed on the insulating liner 142. Thereafter, the insulating liner 142 and/or the inter-gate dielectric film 144 may be planarized to expose a top surface of the capping layer D126.

Figure 18F:
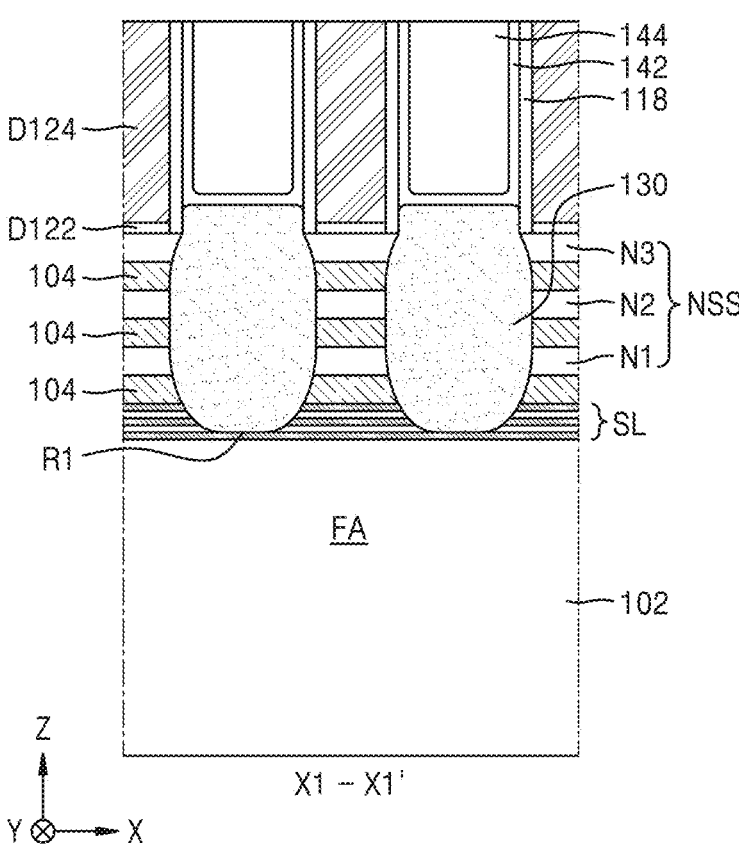

Referring to FIG. 18F, the capping layer D126 may be removed from the resultant structure of FIG. 18E to expose a top surface of the dummy gate layer D124. The insulating liner 142 and/or the inter-gate dielectric film 144 may be partially removed such that a top surface of the inter-gate dielectric film 144 becomes at substantially the same level as the top surface of the dummy gate layer D124.

Figure 18G:
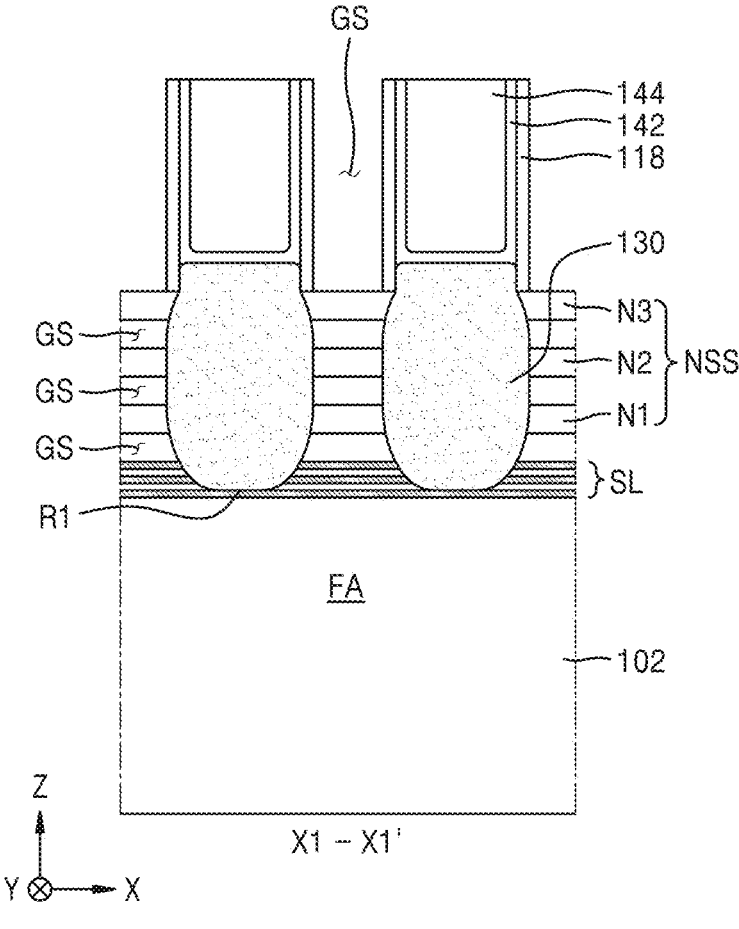

Referring to FIG. 18G, the dummy gate layer D124 and/or the oxide film D122 under the dummy gate layer D124 may be removed from the resultant structure of FIG. 18F to provide a gate space GS. Top surfaces of the plurality of nanosheet stacks NSS and/or the superlattice barrier SL may be exposed through the gate space GS. Thereafter, the plurality of sacrificial semiconductor layers 104 remaining on the superlattice barrier SL may be removed through the gate space GS, and thus, the gate space GS may expand to respective spaces between the first to third nanosheets N1, N2, and/or N3 and a space between the first nanosheet N1 and the superlattice barrier SL.

In example embodiments, to selectively remove the plurality of sacrificial semiconductor layers 104, etch selectivities of the first to third nanosheets N1, N2, and/or N3 and the superlattice barrier SL with respect to the plurality of sacrificial semiconductor layers 104 may be used. A liquid or gaseous etchant may be used to selectively remove the plurality of sacrificial semiconductor layers 104. In example embodiments, to selectively remove the plurality of sacrificial semiconductor layers 104, a $CH_3COOH$-based etchant, for example, an etchant including a mixture of $CH_3COOH$, $HNO_3$, and/or HF and/or an etchant including a mixture of $CH_3COOH$, $H_2O_2$, and/or HF may be used, without being limited thereto.

Figure 18H:
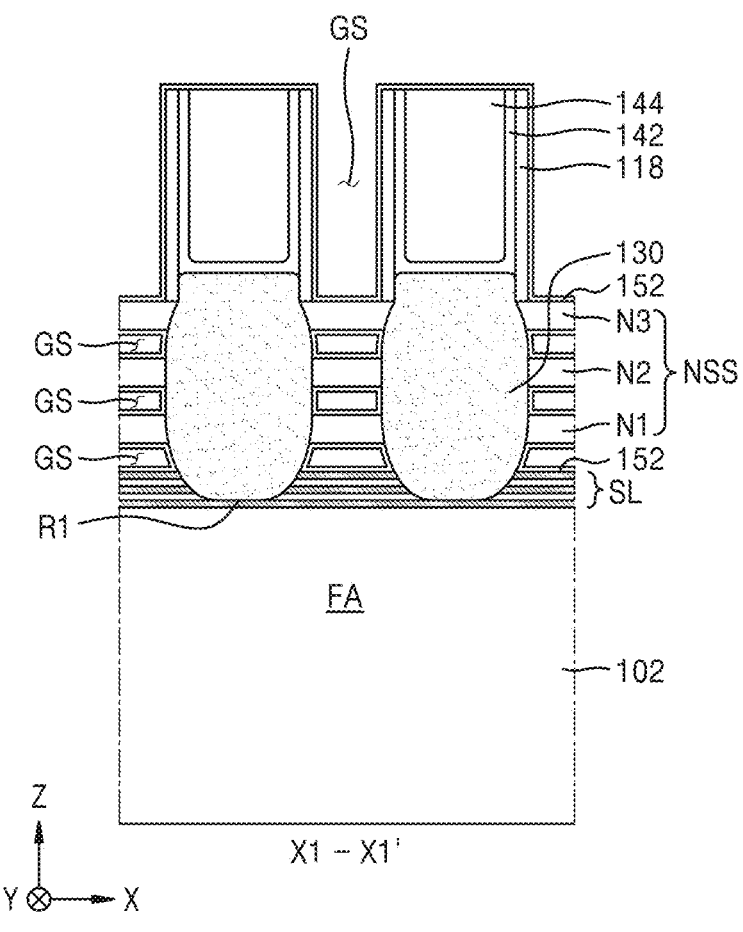

Referring to FIG. 18H, a gate dielectric film 152 may be formed to cover respective exposed surfaces of the first to third nanosheets N1, N2, and/or N3, the superlattice barrier SL, and/or the plurality of source/drain regions 130. The gate dielectric film 152 may be formed using an atomic layer deposition (ALD) process.

Figure 18I:
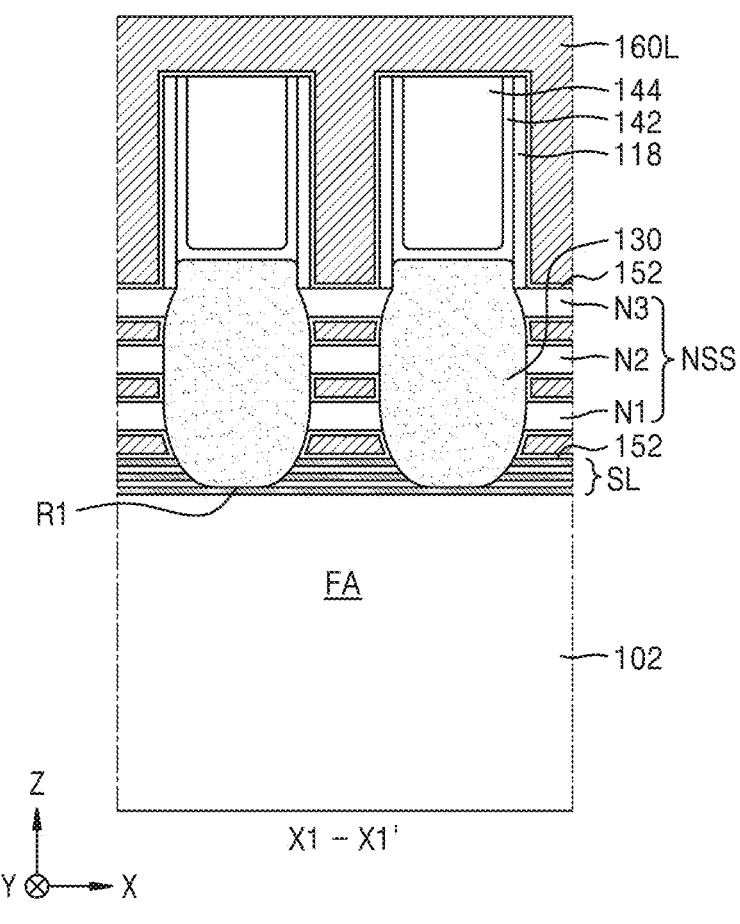

Referring to FIG. 18I, a gate-forming conductive layer 160L may be formed to cover the top surface of the inter-gate dielectric film 144 while filling the gate space (refer to GS in FIG. 18H) on the gate dielectric film 152. The gate-forming conductive layer 160L may include a metal, a metal nitride, and/or a metal carbide, and/or a combination thereof. The gate-forming conductive layer 160L may be formed using an ALD process and/or a CVD process.

Figure 18J:
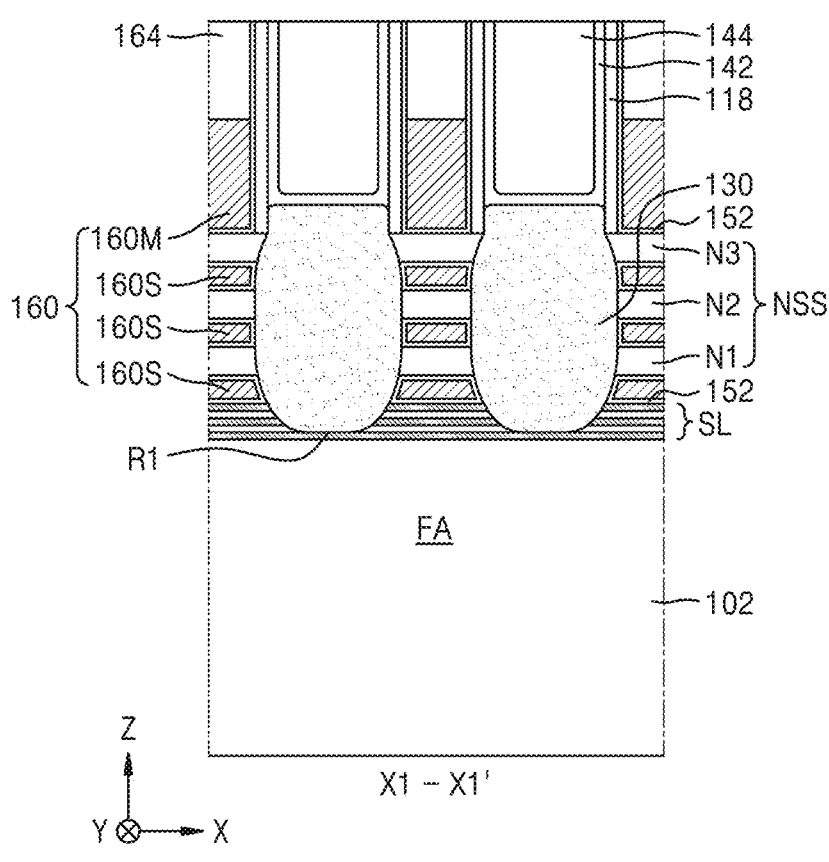

Referring to FIG. 18J, in the resultant structure of FIG. 18I, the gate-forming conductive layer 160L may be partially removed from a top surface thereof to expose the top surface of the inter-gate dielectric film 144 and empty an upper portion of the gate space GS again to form a gate line 160. Thereafter, a capping insulating pattern 164 may be formed on the gate line 160 to fill the gate space GS.

Although the method of manufacturing the IC device 100 shown in FIGS. 1 and 2A to 2D, according to an example embodiment, has been described with reference to FIGS. 18A to 18J, it will be understood that the IC devices 100A, 100B, 100C, 100D, 100E, 200A, 200B, 200C, 300, 300A, 300B, 300C, 400, 500, and 700, which are shown in FIGS. 3A to 17C, and IC devices having various other structures may be manufactured by making various modifications and changes within the scope of the inventive concepts.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
an active region on a substrate extending in a first lateral direction;
a gate line disposed on the active region, the gate line extending in a second lateral direction intersecting the first lateral direction;
a channel region disposed between the substrate and the gate line;

a source/drain region disposed on the active region, the source/drain region having a lowermost surface and a sidewall facing the channel region along the first lateral direction; and a superlattice barrier disposed between the substrate and the channel region such that the substrate, the superlattice barrier, and the channel region are arranged along a vertical direction, the superlattice barrier being in contact with the source/drain region, wherein the superlattice barrier includes a plurality of first sub-layers comprising a semiconductor layer doped with oxygen atoms and a plurality of second sub-layers comprising an undoped semiconductor layer, wherein the plurality of first sub-layers and the plurality of second sub-layers are alternately stacked, wherein the semiconductor layer and the undoped semiconductor layer comprise germanium, and wherein the superlattice barrier continuously extends on the active region in the first lateral direction, and the lowermost surface of the source/drain region is in contact with one of the plurality of first sub-layers or the plurality of second sub-layers, wherein the source/drain region passes through at least a portion of the superlattice barrier in the vertical direction.

2. The integrated circuit device of claim 1, wherein the lowermost surface of the source/drain region is in contact with one of the plurality of first sub-layers included in the superlattice barrier.

3. The integrated circuit device of claim 1, wherein the lowermost surface of the source/drain region is in contact with one of the plurality of second sub-layers included in the superlattice barrier.

4. The integrated circuit device of claim 1, wherein the lowermost surface of the source/drain region is in contact with an uppermost one of the plurality of first sub-layers included in the superlattice barrier.

5. The integrated circuit device of claim 1, wherein the lowermost surface of the source/drain region is closer to the substrate than a lowermost surface of the superlattice barrier.

6. The integrated circuit device of claim 1, further comprising a gate dielectric film between the superlattice barrier and a lowermost surface of the gate line, wherein an uppermost surface of the superlattice barrier is in contact with the gate dielectric film.

7. The integrated circuit device of claim 1, further comprising:

a gate dielectric film between the superlattice barrier and a lowermost surface of the gate line; and an upper semiconductor layer between the gate dielectric film and an uppermost surface of the superlattice barrier, wherein the upper semiconductor layer comprises a portion in contact with the source/drain region.

8. The integrated circuit device of claim 1, further comprising a well configured to surround the source/drain region and the superlattice barrier in the substrate, wherein the well comprises an impurity region of a conductivity type opposite to a conductivity type of the source/drain region.

9. The integrated circuit device of claim 1, wherein a portion of the superlattice barrier in contact with the source/drain region comprises a shoulder portion comprising a portion of an uppermost one of the plurality of first sub-layers included in the superlattice barrier.

10. The integrated circuit device of claim 1, wherein an oxygen atom concentration of each of the plurality of first sub-layers is non-uniform according to a position of each of the plurality of first sub-layers.

11. An integrated circuit device comprising:

an active region on a substrate extending in a first lateral direction;

a gate line disposed on the active region, the gate line extending in a second lateral direction intersecting the first lateral direction;

a channel region disposed between the substrate and the gate line;

a pair of source/drain regions disposed on both sides of the channel region and on the active region, each of the pair of source/drain regions having a lowermost surface; and a superlattice barrier disposed between the active region and the channel region such that the substrate, the superlattice barrier, and the channel region are arranged along a vertical direction, the superlattice barrier being in contact with the pair of source/drain regions, wherein the superlattice barrier includes a plurality of first sub-layers comprising a semiconductor layer doped with oxygen atoms and a plurality of second sub-layers comprising an undoped semiconductor layer, wherein the plurality of first sub-layers and the plurality of second sub-layers are alternately stacked, wherein the semiconductor layer and the undoped semiconductor layer comprise germanium, and wherein the superlattice barrier continuously extends on the active region in the first lateral direction, and each of the lowermost surfaces of the pair of source/drain regions is in contact with one of the plurality of first sub-layers or the plurality of second sub-layers, wherein the pair of source/drain regions passes through at least a portion of the superlattice barrier in the vertical direction.

12. The integrated circuit device of claim 11, wherein the superlattice barrier intermittently extends on the active region in the first lateral direction, and the lowermost surfaces of the pair of source/drain regions are closer to the substrate than a lowermost surface of the superlattice barrier.

13. The integrated circuit device of claim 11, further comprising a gate dielectric film between the superlattice barrier and a lowermost surface of the gate line, wherein an uppermost surface of the superlattice barrier is in contact with the gate dielectric film.

14. The integrated circuit device of claim 11, further comprising:

a gate dielectric film between the superlattice barrier and a lowermost surface of the gate line; and an upper semiconductor layer between the gate dielectric film and an uppermost surface of the superlattice barrier, wherein the upper semiconductor layer comprises a portion in contact with the pair of source/drain regions.

15. An integrated circuit device comprising:

an active region on a substrate extending in a first lateral direction;

a nanosheet stack disposed on the active region, the nanosheet stack comprising at least one nanosheet;

a gate line surrounding the at least one nanosheet and disposed on the active region, the gate line extending in a second lateral direction intersecting the first lateral direction;

a superlattice barrier disposed between the active region and the nanosheet stack, the superlattice barrier including a recess passing through at least a portion of the superlattice barrier in a vertical direction; and a source/drain region disposed inside the recess, the source/drain region comprising a first portion in contact with the superlattice barrier and a second portion in contact with the at least one nanosheet, wherein the superlattice barrier includes a plurality of first sub-layers comprising a semiconductor layer doped with oxygen atoms and a plurality of second sub-layers comprising an undoped semiconductor layer, wherein the plurality of first sub-layers and the plurality of second sub-layers are alternately stacked, wherein the semiconductor layer and the undoped semiconductor layer comprise germanium, and wherein the superlattice barrier continuously extends on the active region in the first lateral direction, and the first portion of the source/drain region is in contact with one of the plurality of first sub-layers and one of the plurality of second sub-layers.

16. The integrated circuit device of claim 15, further comprising a gate dielectric film between the superlattice barrier and a lowermost surface of the gate line, wherein an uppermost surface of the superlattice barrier is in contact with the gate dielectric film.

17. The integrated circuit device of claim 15, further comprising:

a gate dielectric film between the superlattice barrier and a lowermost surface of the gate line; and an upper semiconductor layer between the gate dielectric film and an uppermost surface of the superlattice barrier, wherein the upper semiconductor layer comprises a portion in contact with the source/drain region.

18. The integrated circuit device of claim 1, wherein each of the plurality of first sub-layers and each of the plurality of second sub-layers are between 1 nm and 10 nm in thickness.

19. The integrated circuit device of claim 15, wherein each of the plurality of first sub-layers and each of the plurality of second sub-layers are between 1 nm and 10 nm in thickness.

20. The integrated circuit device of claim 1, further comprising a nanosheet stack comprising at least one nanosheet, wherein the at least one nanosheet comprises the channel region, wherein the gate line surrounds the at least one nanosheet, and wherein the superlattice barrier is disposed between the active region and the nanosheet stack in the vertical direction.

* * * * *